United States Patent
Nosaka

(10) Patent No.: US 11,489,514 B2
(45) Date of Patent: Nov. 1, 2022

(54) RADIO-FREQUENCY FILTER, MULTIPLEXER, RADIO-FREQUENCY FRONT-END CIRCUIT, AND COMMUNICATION DEVICE

(71) Applicant: Murata Manufacturing Co., Ltd., Nagaokakyo (JP)

(72) Inventor: Koji Nosaka, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 334 days.

(21) Appl. No.: 16/733,239

(22) Filed: Jan. 3, 2020

(65) Prior Publication Data
US 2020/0144992 A1  May 7, 2020

Related U.S. Application Data

(63) Continuation of application No. PCT/JP2018/024735, filed on Jun. 28, 2018.

(30) Foreign Application Priority Data

Jul. 10, 2017  (JP) .............................. JP2017-134989

(51) Int. Cl.
*H03H 9/64* (2006.01)
*H03H 9/145* (2006.01)
(Continued)

(52) U.S. Cl.
CPC .......... *H03H 9/6476* (2013.01); *H03H 9/145* (2013.01); *H03H 9/725* (2013.01);
(Continued)

(58) Field of Classification Search
CPC .... H03H 9/6476; H03H 9/725; H03H 9/6483; H03H 2210/021; H03H 2210/025; H03H 210/026; H04B 1/44
See application file for complete search history.

(56) References Cited

U.S. PATENT DOCUMENTS 8,838,045 B2 * 9/2014 Caron ...................... H04B 1/52
455/81
9,041,484 B2 * 5/2015 Burgener ............. H03H 9/6403
333/133
2009/0251235 A1  10/2009 Belot et al.

FOREIGN PATENT DOCUMENTS

JP        09-8621 A     1/1997
JP      1998-336000 A   12/1998
(Continued)

OTHER PUBLICATIONS

English Translation of the Written Opinion of the International Search Authority dated Aug. 28, 2018 for PCT/JP2018/024735, 7 pages.

(Continued)

*Primary Examiner* — Dinh T Le
(74) *Attorney, Agent, or Firm* — Xsensus LLP

(57) ABSTRACT

A radio-frequency filter includes a series-arm circuit on a circuit path that connects a first input/output terminal and a second input/output terminal. A parallel-arm circuit is connected to a node on the path and ground. The series-arm circuit includes a first impedance element, a first switch element connected to the first impedance element, and a series-arm resonator connected in parallel to the first impedance element and the first switch element. The parallel-arm circuit includes a first parallel-arm resonator, and a first switch circuit connected in series to the first parallel-arm resonator, the first switch circuit includes a second switch element. The first and second switch elements and the second switch elements include one or more transistors, and a gate width of the transistors included in the second switch element is larger than that of at least one of the transistors included in the first switch element.

20 Claims, 19 Drawing Sheets

(51) Int. Cl.
    *H03H 9/72* (2006.01)
    *H04B 1/44* (2006.01)
(52) U.S. Cl.
    CPC ............ *H04B 1/44* (2013.01); *H03H 9/6483* (2013.01); *H03H 2210/021* (2013.01); *H03H 2210/025* (2013.01); *H03H 2210/026* (2013.01)

(56) References Cited

FOREIGN PATENT DOCUMENTS

| | | |
|---|---|---|
| JP | 2000-323961 A | 11/2000 |
| JP | 2008-11320 A | 1/2008 |
| JP | 2009-130831 A | 6/2009 |
| JP | 2014-502803 A | 2/2014 |
| WO | 2016/208677 A1 | 12/2016 |

OTHER PUBLICATIONS

International Search Report and Written Opinion dated Aug. 28, 2018 for PCT/JP2018/024735 filed on Jun. 28, 2018, 9 pages including English Translation of the International Search Report.

* cited by examiner

RADIO-FREQUENCY FILTER, MULTIPLEXER, RADIO-FREQUENCY FRONT-END CIRCUIT, AND COMMUNICATION DEVICE

CROSS REFERENCE TO RELATED APPLICATIONS

This is a continuation application of PCT Patent Application No. PCT/JP2018/024735 filed on Jun. 28, 2018, designating the United States of America, which is based on and claims priority of Japanese Patent Application No. 2017-134989 filed on Jul. 10, 2017. The entire disclosures of the above-identified applications, including the specifications, drawings and claims are incorporated herein by reference in their entirety.

FIELD

The present disclosure relates to a radio-frequency filter, a multiplexer, a radio-frequency front-end circuit, and a communication device that include a resonator.

BACKGROUND

Radio-frequency filters being frequency-tunable (tunable filters) have conventionally been proposed as radio-frequency filters that are multi-band compatible.

Such a radio-frequency filter being frequency-tunable includes a ladder circuit of multiple series-arm circuits and multiple parallel-arm circuits. A configuration is known, as the parallel-arm circuit in which a parallel-arm resonator is connected in series to a circuit constituted by a capacitor and a switch element connected in parallel (see, for example, Patent Literature (PTL) 1).

With the above conventional configuration, since a resonant frequency, which is the point at which an impedance of the parallel-arm circuit is at a local minimum, is changed, it is possible to change a frequency of an attenuation pole configured through the resonant frequency, by switching between conduction (ON) and non-conduction (OFF) of a switch.

CITATION LIST

Patent Literature

[PTL 1] U.S. Unexamined Patent Application Publication No. 2009/0251235

SUMMARY

Technical Problem

As recognized by the present inventor, when adopting the radio-frequency filter as disclosed in PTL 1 as, for example, a transmission filter, the radio-frequency filter requires power durability. The term "power durability" refers to an ability of a circuit structure (e.g., a filter or switch) to avoid being structural damaged, and avoid experiencing associated deterioration of specified performance characteristics, when exposed to temporary or sustained high power operational conditions (e.g., high current, or voltage potential operational conditions). It is desired to improve power durability of the parallel-arm circuit, similar to the series-arm circuit, in order to improve the power durability of the radio-frequency filter. When improving resistance to damage of parallel-arm circuit from the electric power (i.e., power durability), it is imperative to not only improve power durability of the parallel-arm resonator, but also power durability of the switch included in the parallel-arm circuit.

For the conventional technique, however, when adopting the above radio-frequency filter for use in multi-band systems, scaling down the switch element and low loss when the switch element is conducting were priority issues, but a configuration that improves power durability having a trade-off relationship between scaling down the above switch element and low loss had not been studied.

Accordingly, the present disclosure aims to ensure power durability while reducing insertion loss within a passband and scaling down a radio-frequency filter being frequency-tunable and a multiplexer, a radio-frequency front-end circuit, and a communication device including the radio-frequency filter.

Solutions to Problem

In order to achieve the above objective, a radio-frequency filter includes a series-arm circuit on a circuit path that connects a first input/output terminal and a second input/output terminal. A parallel-arm circuit is connected to a node on the path and ground. The series-arm circuit includes a first impedance element, a first switch element connected to the first impedance element, and a series-arm resonator connected in parallel to the first impedance element and the first switch element. The parallel-arm circuit includes a first parallel-arm resonator, and a first switch circuit connected in series to the first parallel-arm resonator, the first switch circuit includes a second switch element. The first and second switch elements and the second switch elements include one or more transistors, and a gate width of the transistors included in the second switch element is larger than that of at least one of the transistors included in the first switch element.

In the radio-frequency filter configured as such, an anti-resonant frequency of the series-arm circuit arm circuit is changed by switching between conduction and non-conduction of the first switch element, and a resonant frequency of the parallel-arm circuit is changed by switching between conduction and non-conduction of the second switch element. The antiresonant frequency of the series-arm circuit arm circuit and the resonant frequency of the parallel-arm circuit form an attenuation pole of the radio-frequency filter. Accordingly, the radio-frequency filter is frequency-tunable, making it possible to change a frequency of at least one of a passband and an attenuation band, by switching between conduction and non-conduction of the first switch element and the second switch element.

A magnitude of a current flowing to the switch elements realizing the frequency-tunable function of such a radio-frequency filter is proportional to an amount of high-frequency electric power applied to the radio-frequency filter. (The present disclosure uses high-frequency in reference to radio-frequency). Accordingly, in order to realize the power durability that the radio-frequency filter requires, it is desired to ensure the ability to withstand sometimes high electrical current flow of the switch elements. The current flowing to the first switch element when the first switch element is conducting is at a maximum at the antiresonant frequency at which an impedance of the series-arm circuit arm circuit is at a local maximum. However, the current flowing to the second switch element when the second switch element is conducting is at a maximum at the resonant frequency at which an impedance of the parallel-arm circuit is at a local minimum. Accordingly, the current flowing when the second switch element is conducting is greater than the current flowing when the first switch element is conducting. Accordingly, it is possible to ensure a withstand current realizing the power durability that the radio-frequency filter requires while reducing a total size of the first switch element and the second switch element, due to the gate width of each of the one or more transistors included in the second switch element being larger than the at least one gate width of each of the one or more transistors included in the first switch element. It is possible to reduce a resistance when the second switch element is conducting (ON resistance), due to the gate width of the second switch element being relatively large. As such, it is possible to reduce insertion loss within the passband of the radio-frequency filter when the second switch element is conducting. In other words, it is possible to ensure power durability while reducing insertion loss within the passband and scaling down the radio-frequency filter being frequency-tunable.

When a total number of the one or more transistors in each of the first switch element and the second switch element indicates a stack number, a stack number of the first switch element and a stack number of the second switch element may be different.

This makes it possible to reduce the total size of the first switch element and the second switch element while ensuring an ability to each structurally withstand voltages (voltage resistance) of the first switch element and the second switch element, by suitably designing the stack numbers in accordance with a voltage applied when the switch elements are not conducting. Due to the stack number of one of the first switch element and the second switch element being relatively lower than the stack number of an other of the first switch element and the second switch element, it is possible to reduce the resistance when the one of the first switch element and the second switch element is conducting. As such, it is possible to reduce insertion loss within the passband when the one of the first switch element and the second switch element is conducting. In other words, it is possible to ensure power durability while reducing insertion loss within the passband and scaling down the radio-frequency filter being frequency-tunable.

The stack number of the first switch element may be lower than the stack number of the second switch element.

In this regard, the voltage applied to the first switch element is at a maximum at the antiresonant frequency of the series-arm circuit arm circuit when the first switch element is not conducting. However, the voltage applied to the second switch element is at a maximum at the resonant frequency of the parallel-arm circuit when the second switch element is not conducting. At this point, a maximum voltage applied to the first switch element is lower than a maximum voltage applied to the second switch element. Accordingly, it is possible to scale down the first switch element while ensuring a withstand voltage realizing the power durability that the radio-frequency filter and the like require, by reducing the stack number of the first switch element. It is possible to limit the resistance when the first switch element is conducting, by reducing the stack number of the first switch element. Accordingly, it is possible to reduce insertion loss within the passband of the radio-frequency filter when the first switch element is conducting. In other words, it is possible to ensure power durability while reducing insertion loss within the passband and scaling down the radio-frequency filter being frequency-tunable.

The first input/output terminal may be a terminal to which high-frequency electric power is applied, and the node may be located on the path between the series-arm circuit and the second input/output terminal.

In other words, the parallel-arm circuit is connected via the series-arm circuit arm circuit from the terminal to which high-frequency electric power is applied. This makes it possible to reduce a total stack number that is a total amount of the stack numbers of the first switch element and the second switch element, since it is possible reduce a total voltage that is a total amount of the voltages applied when both of the switch elements are not conducting. As such, it is possible to reduce the total size of the first switch element and the second switch element while ensuring individual withstand voltages of the first switch element and the second switch element. In other words, it is possible to ensure power durability while further scaling down the radio-frequency filter being frequency-tunable.

The first switch circuit may further include a second impedance element that is one of an inductor and a capacitor, the second impedance element being connected to the second switch element.

With this, the resonant frequency of the parallel-arm circuit is changed by switching between conduction and non-conduction of the second switch element. Since the resonant frequency of the parallel-arm circuit forms the attenuation pole of the radio-frequency filter, the radio-frequency filter makes it possible to change the frequency of the attenuation pole, by switching between conduction and non-conduction of the second switch element.

The first switch circuit may be a circuit that is constituted by the second impedance element and the second switch element connected in parallel.

This makes it possible to change the frequency of the attenuation pole at a low side of the passband (is variable), by switching between conduction and non-conduction of the second switch element.

The first switch circuit may further include a third impedance element that is an other of the inductor and the capacitor, the third impedance element being connected in series to the second switch element. A circuit that is constituted by the third impedance element and the second switch element connected in series may be connected in parallel to the second impedance element.

This makes it possible to change the frequency of the attenuation pole at the low side of the passband to a wider range.

The first switch circuit may include a plurality of circuits each of which is the circuit that is constituted by the third impedance element and the second switch element connected in series. The plurality of circuits may be connected in parallel to one another and are connected in parallel to the second impedance element.

This makes it possible to subtly change the frequency of the attenuation pole at the low side of the passband.

The parallel-arm circuit may further include a second parallel-arm resonator connected in parallel to a circuit that is constituted by the first parallel-arm resonator and the first switch circuit connected in series. A resonant frequency of the first parallel-arm resonator may be lower than a resonant frequency of the second parallel-arm resonator. An antiresonant frequency of the first parallel-arm resonator may be lower than an antiresonant frequency of the second parallel-arm resonator.

This makes it possible to change the frequency of the attenuation pole at the low side of the passband, without needing to worsen insertion loss within the passband (i.e., while limiting an increase in insertion loss).

The parallel-arm circuit may further include a second parallel-arm resonator connected in parallel to a circuit that is constituted by the first parallel-arm resonator and the first switch circuit connected in series. A resonant frequency of the first parallel-arm resonator may be higher than a resonant frequency of the second parallel-arm resonator. An antiresonant frequency of the first parallel-arm resonator may be higher than an antiresonant frequency of the second parallel-arm resonator.

This makes it possible to change the frequency of the attenuation pole at a high side of the passband, without needing to worsen insertion loss within the passband.

The second impedance element may be the capacitor, and an electrostatic capacitance of the first parallel-arm resonator may be greater than an electrostatic capacitance of the second parallel-arm resonator.

In this regard, the second switch element is included in the first switch circuit connected in series to the first parallel-arm resonator. Accordingly, the voltage applied to an OFF capacitor, which is a capacitance component of the second switch element, when the second switch element is not conducting is dependent on the electrostatic capacitance of the first parallel-arm resonator, and, to be specific, decreases with an increase in the electrostatic capacitance of the first parallel-arm resonator. Accordingly, by making the electrostatic capacitance of the first parallel-arm resonator greater than the electrostatic capacitance of the second parallel-arm resonator, it is possible to reduce the stack number of the second switch element, since it is possible to lower the voltage applied to the second switch element. It is, therefore, possible to scale down the second switch element while ensuring a withstand voltage.

The parallel-arm circuit may further include a second parallel-arm resonator, and a second switch circuit connected in series to the second parallel-arm resonator. The second switch circuit may include a fourth impedance element that is one of an inductor and a capacitor; and a third switch element that is connected in parallel to the fourth impedance element, and includes one or more transistors. A resonant frequency of the first parallel-arm resonator and a resonant frequency of the second parallel-arm resonator may be different. An antiresonant frequency of the first parallel-arm resonator and an antiresonant frequency of the second parallel-arm resonator may be different. A circuit that is constituted by the first parallel-arm resonator and the first switch circuit connected in series and a circuit that is constituted by the second parallel-arm resonator and the second switch circuit connected in series may be connected in parallel.

This makes it possible to change the frequency of the attenuation pole at the low side of the passband and the high side of the passband, without needing to worsen insertion loss within the passband.

A gate width of each of the one or more transistors included in the third switch element may be larger than the gate width of the at least one of the one or more transistors included in the first switch element.

This makes it possible to ensure individual withstand currents of the first switch element, the second switch element, and the third switch element that realize the power durability that the radio-frequency filter requires, while reducing the total size of the first switch element, the second switch element, and the third switch element. It is possible to reduce the resistance when the second switch element and the third switch element are conducting (ON resistance), due to the gate widths of the second switch element and the third switch element being relatively large. As such, it is possible to reduce insertion loss within the passband of the radio-frequency filter when the second switch element and the third switch element are conducting. In other words, it is possible to ensure power durability while reducing insertion loss within the passband and scaling down the radio-frequency filter that is capable of changing the frequency of the attenuation pole, without needing to worsen insertion loss within the passband.

The resonant frequency of the second parallel-arm resonator may be lower than the resonant frequency of the first parallel-arm resonator. The antiresonant frequency of the second parallel-arm resonator may be lower than the antiresonant frequency of the first parallel-arm resonator. When a total number of the one or more transistors in each of the first switch element, the second switch element, and the third switch element indicates a stack number, the stack number of the first switch element may be lower than the stack number of the second switch element, and a stack number of the third switch element may be lower than the stack number of the first switch element.

In this regard, the voltage applied to the first switch element is at a maximum at the antiresonant frequency of the series-arm circuit arm circuit when the first switch element is not conducting. However, the voltage applied to the second switch element is at a maximum at the resonant frequency that is more to a high frequency side among two resonant frequencies of the parallel-arm circuit (i.e., the resonant frequency of the first parallel-arm resonator) when the second switch element is not conducting. The voltage applied to the third switch element is at a maximum at the resonant frequency that is more to a low frequency side among two resonant frequencies of the parallel-arm circuit (i.e., the resonant frequency of the second parallel-arm resonator) when the third switch element is not conducting. At this point, the maximum voltage applied to the first switch element is lower than the maximum voltage applied to the second switch element, and a maximum voltage applied to the third switch element is lower than the maximum voltage applied to the first switch element. Accordingly, it is possible to reduce the total size of the first switch element and the third switch element while ensuring individual withstand voltages of the first switch element and the third switch element that realize the power durability that the radio-frequency filter requires, by reducing the stack number of the first switch element and further reducing the stack number of the third switch element. It is possible to limit the resistance when the first switch element and the third switch element are conducting, by reducing the stack numbers of the first switch element and the third switch element. Accordingly, it is possible to reduce insertion loss within the passband of the radio-frequency filter when the first switch element and the third switch element are conducting. In other words, it is possible to ensure power durability while further reducing insertion loss within the passband and further scaling down the radio-frequency filter that is capable of changing the frequency of the attenuation pole, without needing to worsen insertion loss within the passband.

A multiplexer according to an aspect of the present disclosure includes a plurality of filters that include any of the above radio-frequency filters. One input/output terminal of each of the plurality of filters is directly or indirectly connected to a common terminal.

Such a multiplexer makes it possible to ensure power durability, while reducing insertion loss within the passband and scaling down the multiplexer.

A radio-frequency front-end circuit according to one aspect of the present disclosure includes any of the above radio-frequency filters or the above multiplexer; and an amplifier circuit directly or indirectly connected to the radio-frequency filter or the multiplexer.

Such a radio-frequency front-end circuit makes it possible to ensure power durability, while improving a gain loss within the passband and scaling down the radio-frequency front-end circuit.

The amplifier circuit is a power amplifier that amplifies a high-frequency transmission signal. The high-frequency transmission signal amplified by the power amplifier is inputted to the first input/output terminal or the second input/output terminal of the radio-frequency filter.

This makes it possible to provide a transmission-type radio-frequency front-end circuit that is capable of ensuring power durability, while improving the gain within the passband and scaling down the radio-frequency front-end circuit.

The amplifier circuit is a low-noise amplifier that amplifies a high-frequency reception signal. The high-frequency reception signal amplified by the low-noise amplifier is outputted from the first input/output terminal or the second input/output terminal of the radio-frequency filter.

This makes it possible to provide a reception-type radio-frequency front-end circuit that is capable of ensuring power durability, while improving the gain within the passband and scaling down the radio-frequency front-end circuit.

A communication device according to an aspect of the present disclosure includes a radio frequency (RF) signal processing circuit that processes a high-frequency signal to be transmitted by an antenna element and a high-frequency signal received by the antenna element; and any of the radio-frequency front-end circuits that transmits the high-frequency signals between the antenna element and the RF signal processing circuit.

Such a communication device makes it possible to ensure power durability, while improving communication quality and scaling down the communication device.

Advantageous Effects

The present disclosure is capable of ensuring power durability while reducing insertion loss within a passband and scaling down a radio-frequency filter being frequency-tunable and a multiplexer, a radio-frequency front-end circuit, and a communication device that include the radio-frequency filter.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Figure 1A:
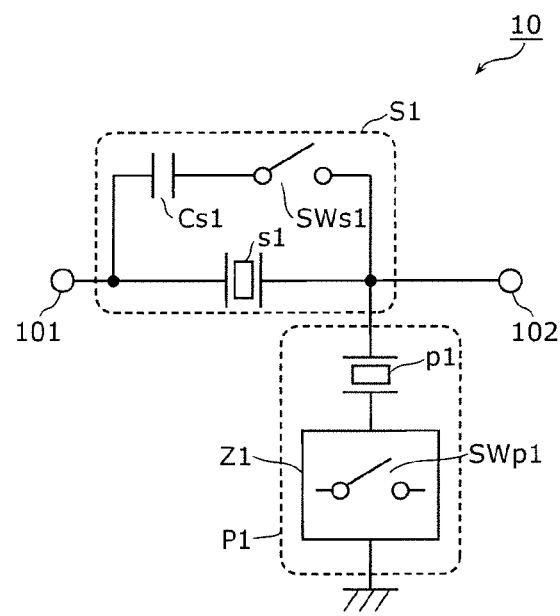
FIG. 1A is a circuit block diagram of a filter according to Embodiment 1.

Hereinafter, embodiments of the present disclosure will be described in detail with reference to examples and the drawings. Note that each of the embodiments described below shows a comprehensive or specific example in the present disclosure. Numerical values, shapes, materials, components, placement and connection of the components, and the like are mere examples and are not intended to limit the present disclosure. Components in the following embodiments not mentioned in any of the independent claims are described as optional elements. The sizes or ratios of sizes of components shown in the drawings are not necessarily strictly accurate. In the drawings, components that are substantially the same as components described previous thereto have the same reference numerals and overlapping descriptions may be omitted or simplified.

Resonant frequency in a resonator or a circuit is the resonant frequency for forming (i) a passband of a filter including the resonator or the circuit, or (ii) an attenuation pole close to the passband, and a frequency of a "resonance point" that is the point at which an impedance of the resonator or the circuit is at a local minimum (ideally the point at which the impedance becomes 0), unless otherwise noted.

Antiresonant frequency in a resonator or a circuit is the antiresonant frequency for forming (i) the passband of the filter including the resonator or the circuit, or (ii) the attenuation pole close to the passband, and a frequency of an "antiresonance point" that is the point at which the impedance of the resonator or the circuit is at a local maximum (ideally the point at which the impedance becomes limitless), unless otherwise noted.

Note that in the following embodiments, series-arm circuit arm circuit and parallel-arm circuit are defined as follows.

The parallel-arm circuit is disposed between a ground and a node on a path that connects a first input/output terminal and a second input/output terminal.

The series-arm circuit is (i) disposed between the first input/output terminal or the second input/output terminal and the node on the path connected to the parallel-arm circuit, or (ii) disposed between one node on the path connected to one parallel-arm circuit and another node on the path connected to another parallel-arm circuit.

Hereinafter, "low end of the passband" means "lowest frequencies within the passband." "High end of the passband" means "highest frequencies within the passband". Hereinafter, "low side of the passband" means "frequencies outside of the passband and lower than the passband." Hereinafter, "high side of the passband" means "frequencies outside of the passband and higher than the passband". Hereinafter, "low frequency side" may be referred to as "low side" and "high frequency side" as "high side". "High-frequency" generally means frequencies in the radio frequency (RF) band (e.g., 800 MHz to 900 MHz range), and thus high-frequency filter and RF filter are used synonymously herein. When referring to "passband", generally the passband is defined by the filter's 3 dB attenuation points.

Embodiment 1

1) Basic Configuration of Radio-Frequency Filter

FIG. 1A is a circuit block diagram of filter 10 according to Embodiment 1. Filter 10 shown in the drawing includes series-arm circuit S1, parallel-arm circuit P1, input/output terminal 101, and input/output terminal 102.

This filter 10 is a radio-frequency filter that allows a high-frequency signal with a desired frequency among high-frequency signals inputted to one of input/output terminals 101 and 102 to pass, and outputs the high-frequency signal from an other of input/output terminals 101 and 102. In other words, the one input/output terminal is a terminal to which high-frequency electric power is applied.

Note that when filter 10 is used as, for example, a multiplexer transmission filter or a time division duplex (TDD) filter, high-frequency transmission electric power is applied to one of the input/output terminals, and high-frequency reception electric power is applied to the other of the input/output terminals. However, in this case, a terminal to which more high-frequency electric power can be applied among input/output terminals 101 and 102 is defined as the terminal to which the high-frequency electric power for filter 10 is applied.

Series-arm circuit S1 is disposed on a path that connects input/output terminal 101 and input/output terminal 102. To be specific, series-arm circuit S1 includes series-arm resonator S1, capacitor Cs1 that is an example of a first impedance element, and switch SWs1 that is a first switch element connected in series to capacitor Cs1. Series-arm resonator s1 is connected in parallel to capacitor Cs1 and switch SWs1. In other words, series-arm resonator s1 is connected in parallel to a circuit constituted by capacitor Cs1 and switch SWs1 connected in series.

Note that series-arm circuit S1 may include an inductor, which is another example of the first impedance element, instead of capacitor Cs1.

Parallel-arm circuit P1 is connected to the ground and the node on the path that connects input/output terminal 101 and input/output terminal 102. In the present embodiment, parallel-arm circuit P1 is connected to the ground and a node on the path between series-arm circuit S1 and input/output terminal 102. To be specific, parallel-arm circuit P1 includes parallel-arm resonator p1 that is a first parallel-arm resonator, and switch circuit Z1 that is a first switch circuit connected in series to parallel-arm resonator p1. Switch circuit Z1 includes switch SWp1 that is a second switch element.

Note that parallel-arm circuit P1 may be connected to the ground and a node on the path between input/output terminal 101 and series-arm circuit S1.

Series-arm resonator s1 and parallel-arm resonator p1 are each an acoustic wave resonator using acoustic waves, and use, for example, surface acoustic waves (SAWs) or bulk acoustic waves (BAWs), or are each a film bulk acoustic resonator (FBAR), etc. Note that SAWs do not only include surface waves but also boundary waves. Series-arm resonator s1 and parallel-arm resonator p1 may each be a resonator or a circuit having a resonant frequency at which impedance is at a local minimum (ideally 0) and an antiresonant frequency at which impedance is at a local maximum (ideally limitless), like an equivalent circuit of a resonator including an LC element (circuit that is constituted by (i) a circuit constituted by an inductor and a capacitor connected in series, and (ii) a capacitor connected in parallel to the circuit). Note that hereinafter, the above is not limited to the resonators, and the frequency at which impedance is at a local minimum being referred to as "resonant frequency" and the frequency at which impedance is at a local maximum being referred to as "antiresonant frequency" also applies to the series-arm circuits and the parallel-arm circuits.

Capacitor Cs1 is, for example, disposed on a same chip as the resonator. Note that Capacitor Cs1 may be a variable capacitor such as a varicap or a digitally tunable capacitor (DTC).

Switches SWs1 and SWp1 are each a single pole single throw (SPST) switch element including one or more transistors. In the present embodiment, switches SWs1 and SWp1 each include multiple transistors. To be specific, switches SWs1 and SWp1 each include a field-effect transistor (FET), and contain, for example, gallium arsenide (GaAs) or a complementary metal-oxide-semiconductor (CMOS). It is possible to scale down filter 10, since the switch using such a semiconductor is compact. The FET has a planar structure and is easily integrable since the FET does not impinge on other elements. As such, it is possible to scale down filter 10 and reduce insertion loss within the passband.

Switches SWs1 and SWp1 are each switched between conduction and non-conduction in accordance with a control signal from a controller (not illustrated) such as a radio frequency integrated circuit (RFIC). Note that these configurations will be described later.

In filter 10 configured as such, a resonant frequency of series-arm circuit S1 and an antiresonant frequency of parallel-arm circuit P1 form the passband of filter 10, and an antiresonant frequency of series-arm circuit S1 and a resonant frequency of parallel-arm circuit P1 form an attenuation pole of filter 10.

In series-arm circuit S1, series-arm resonator s1 is connected in parallel to a circuit constituted by capacitor Cs1 and switch SWs1 connected in series. It is possible to change the frequency of the attenuation pole of filter 10, by switching between conduction and non-conduction of switch SWs1, since it is possible to change the antiresonant frequency of series-arm circuit S1. To be specific, when switch SWs1 is not conducting, the antiresonant frequency of series-arm circuit S1 is substantially the same as the antiresonant frequency of series-arm resonator S1, since the circuit that is constituted by capacitor Cs1 and switch SWs1 connected in series does not function. However, when switch SWs1 is conducting, the antiresonant frequency of series-arm circuit S1 is lower than the antiresonant frequency of series-arm resonator S1, since capacitor Cs1 is connected in parallel to series-arm resonator s1 through switch SWs1.

Filter 10 is, therefore, frequency-tunable which makes the frequency of the attenuation pole tunable in accordance with conduction and non-conduction of switch SWs1. A frequency-tunable range of the attenuation pole is dependent on an element value of capacitor Cs1, and, for example, increases with an increase in the element value of capacitor Cs1. Accordingly, it is possible to suitably determine the element value of capacitor Cs1 in accordance with frequency specifications that filter 10 requires.

Filter 10 is frequency-tunable, making it possible to change the frequency of the attenuation pole and the like also in accordance with conduction and non-conduction of switch SWp1 of parallel-arm circuit P1. This will be described in conjunction with a specific circuit configuration example of filter 10.

Figure 1B:
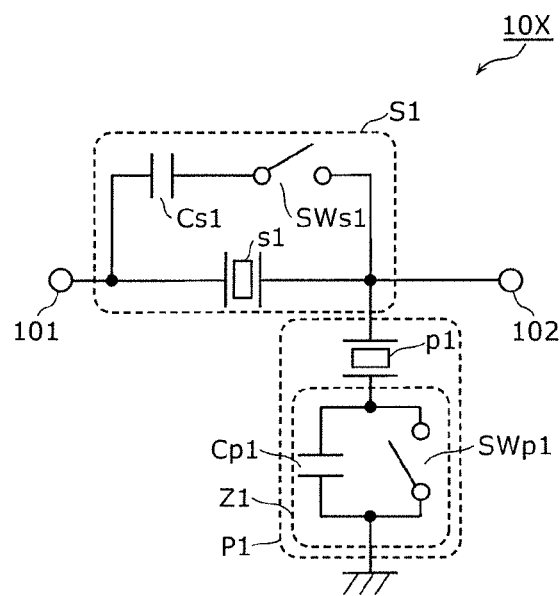
FIG. 1B is a circuit configuration diagram of a filter according to Embodiment 1.

FIG. 1B is a circuit configuration diagram of filter 10X according to Embodiment 1. Filter 10X shown in the drawing is an example of a specific circuit configuration of filter 10.

As is obvious from FIGS. 1A and 1B, switch circuit Z1 includes, to be specific, the above-mentioned switch SWp1 (second switch element), and capacitor Cp1 that is an example of a second impedance element that is one of an inductor and a capacitor, the second impedance element being connected to switch SWp1.

As illustrated in FIG. 1B, switch circuit Z1 is a circuit constituted by capacitor Cp1 and switch SWp1 connected in parallel. Thus, it is possible to change an impedance of switch circuit Z1, by switching between conduction and non-conduction of switch SWp1. As a result, it is possible to change a frequency of an attenuation pole of filter 10X, since it is possible to change the resonant frequency of parallel-arm circuit P1. To be specific, when switch SWp1 is not conducting, the resonant frequency of parallel-arm circuit P1 is higher than the resonant frequency of parallel-arm resonator p1, since capacitor Cp1 is connected in series to parallel-arm resonator p1. However, when switch SWp1 is conducting, the resonant frequency of series-arm circuit P1 is substantially the same as the resonant frequency of parallel-arm resonator p1, since capacitor Cp1 is short-circuited by switch SWp1.

Filter 10X is, therefore, frequency-tunable which makes the frequency of the attenuation pole tunable in accordance with conduction and non-conduction of switch SWp1. A frequency-tunable range of the attenuation pole is dependent on an element value of capacitor Cp1, and, for example, increases with an decrease in the element value of capacitor Cp1. Accordingly, it is possible to suitably determine the element value of capacitor Cp1 in accordance with the frequency specifications that filter 10X requires.

Note that filter 10X may include an inductor, which is another example of the second impedance element, instead of capacitor Cp1.

Filter 10 according to the present embodiment may also not have a configuration in which the switch circuit includes the second impedance element, as in filter 10X.

Figure 1C:
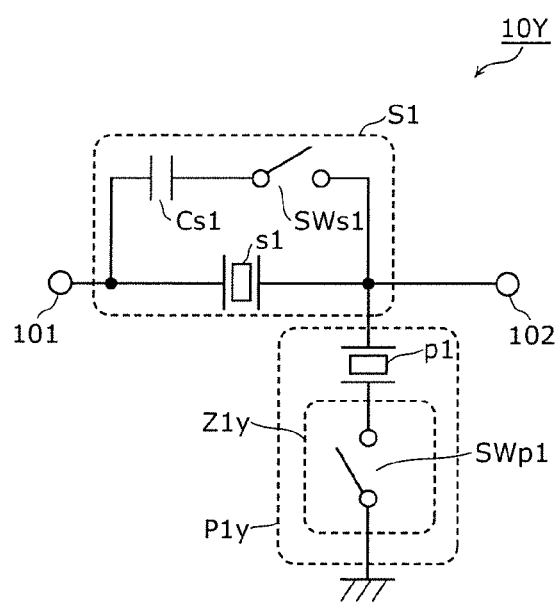
FIG. 1C is another circuit configuration diagram of a filter according to Embodiment 1.

FIG. 1C is another circuit configuration diagram of filter 10 according to Embodiment 1. Filter 10Y shown in the drawing is another example of a specific circuit configuration of filter 10.

Parallel-arm circuit P1y is another example of parallel-arm circuit P1 included in filter 10X, and includes switch circuit Z1y that is another example of switch circuit Z1 included in filter 10X. Switch circuit Z1y differs from switch circuit Z1 included in filter 10X in that switch circuit Z1y does not include capacitor Cp1.

The above circuit configuration makes it is possible to change an impedance of switch circuit Z1y, by switching between conduction and non-conduction of switch SWp1. To be specific, when switch SWp1 is not conducting, a pass characteristic of filter 10Y is that only series-arm circuit S1 functions (e.g. pass characteristic of series-arm circuit S1). However, when switch SWp1 is conducting, the pass characteristics of filter 10Y become characteristics of a ladder filter including series-arm circuit S1 and parallel-arm resonator p1. In other words, filter 10Y is frequency-tunable which makes the frequencies of the passband and the attenuation pole tunable in accordance with conduction and non-conduction of switch SWp1.

2) Structure and Characteristics of Switch Elements

Structures of switches SWs1 and SWp1 included in filter 10 will next be described in detail with reference to switch integrated circuit (IC) 50.

Figure 2A:
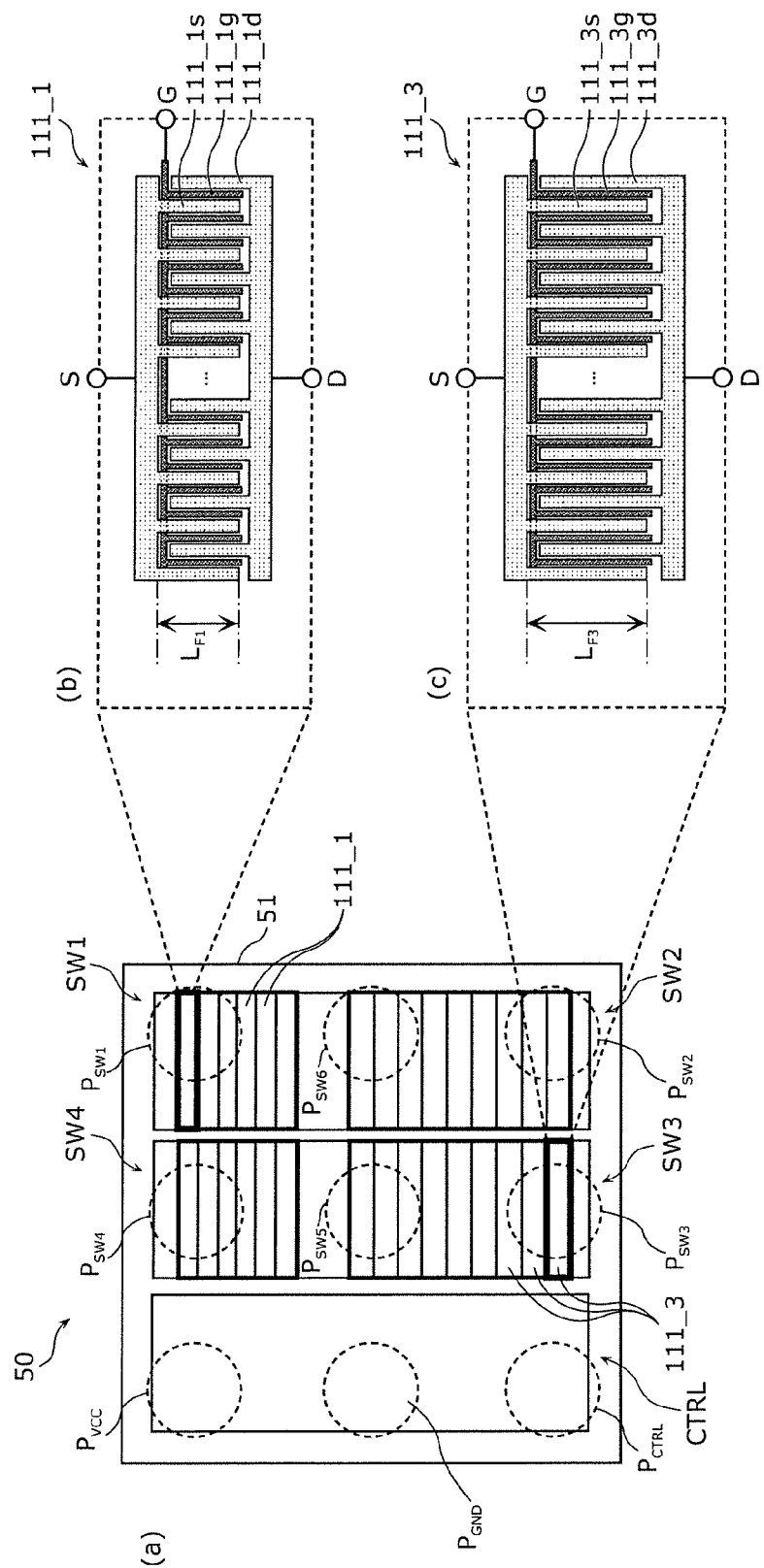
FIG. 2A is a schematic view of a configuration of a switch integrated circuit (IC) according to Embodiment 1.
Figure 2B:
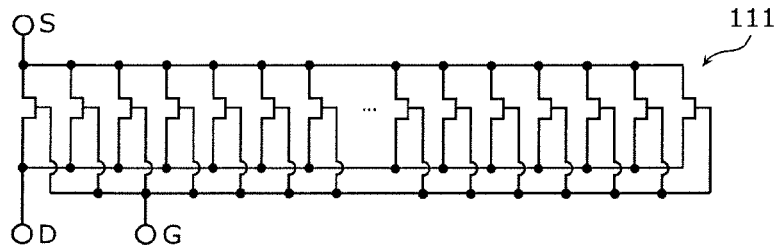
FIG. 2B is a circuit configuration diagram of a transistor included in the switch IC according to Embodiment 1.

FIG. 2A is a schematic view of a configuration of switch IC 50 according to Embodiment 1. FIG. 2B is a circuit configuration diagram of transistor 111 included in switch IC 50. (a) of FIG. 2A shows an implementation example of the switch IC including four switches SW1-SW4.

As illustrated in (a) of FIG. 2A, switches SW1-SW4 are disposed on substrate 51. Power supply terminal $P_{VCC}$; control terminal $P_{CTRL}$; ground terminal $P_{GND}$; and switch terminals $P_{SW1}$, $P_{SW2}$, $P_{SW3}$, $P_{SW4}$, $P_{SW5}$, and $P_{SW6}$ are disposed on a rear surface of substrate 51. Switch SW1 is connected between switch terminals $P_{SW1}$ and $P_{SW6}$, switch SW2 is connected between switch terminals $P_{SW2}$ and $P_{SW6}$, switch SW3 is connected between switch terminals $P_{SW3}$ and $P_{SW5}$, and switch SW4 is connected between switch terminals $P_{SW4}$ and $P_{SW5}$.

When implementing filter 10 according to Embodiment 1 through switch IC 50 shown in FIG. 2A, switch SWs1 included in filter 10 corresponds to switch SW1, switch SWp1 corresponds to switch SW3, and switches SW2 and SW4 are not in use. Note that switch IC 50 is not limited to the configuration shown in FIG. 2A, and may also include only switches SW1 and SW3 among switches SW1-SW4 shown in FIG. 2A.

For example, control circuit CTRL is disposed on substrate 51, control circuit CTRL (i) operating through power supply voltage VCC supplied from a power supply circuit such as a power management IC and (ii) generating multiple switch drive voltages that separately switch between conduction and non-conduction of switches SW1-SW4, in accordance with, for example, the control signal inputted from the RFIC.

Switches SW1-SW4 each include one or more transistors 111, and have a circuit configuration here in which multiple transistors 111 are connected in series.

As illustrated in (b) of FIG. 2A, transistor 111_1 included in switch SW1 is, for example, a FET that includes a source electrode consisting of multiple source electrode fingers 111_1s, a drain electrode consisting of multiple drain electrode fingers 111_1d, and a gate electrode consisting of multiple gate electrode fingers 111_1g. As illustrated in (c) of FIG. 2A, transistor 111_3 included in switch SW3 is, for example, a FET that includes a source electrode consisting of multiple source electrode fingers 111_3s, a drain electrode consisting of multiple drain electrode fingers 111_3d, and a gate electrode consisting of multiple gate electrode fingers 111_3g. In other words, in transistor 111 (111_1 and 111_3), multiple single FETs including source electrode fingers, drain electrode fingers, and gate electrode fingers that face one another are disposed in parallel (comb-shaped).

In switches SW1-SW4 configured as such, a length overlapping the electrode fingers included in one transistor 111 is referred to as finger length $L_F$, and finger length $L_F$ multiplied by finger number $N_F$ is referred to as gate width W. The number of transistors 111 included in one switch is referred to as stack number Ns.

Gate width W2 of each of one or more (here, multiple) transistors 111_2 included in switch SW3 is larger than gate width W1 of at least one of one or more (here, multiple) transistors 111_1 included in switch SW1. In other words, the gate width of each of the transistors included in switch SWp1 that is the second switch element is larger than the gate width of at least one of the transistors included in switch SWs1 that is the first switch element. Hereinafter, switch SW3 is described as including multiple transistors 111_3 having the same configuration, and switch SW1 as including multiple transistors 111_1 having the same configuration, for the sake of brevity. Gate width W2 of each of the multiple transistors 111_2 included in switch SW3 is larger than gate width W1 of any of the multiple transistors 111_1 included in switch SW1. Note that hereinafter, the gate width of the transistor included in a switch may be simply referred to as "gate width of the switch".

For example, as illustrated in (b) and (c) of FIG. 2A, when finger number $N_{F1}$ of switch SW1 and finger number $N_{F3}$ of switch SW3 are the same, finger length $L_{F3}$ of switch SW3 is longer than finger length $L_{F1}$ of switch SW1. Note that the above is not limited thereto. Finger length $L_{F3}$ of switch SW3 and finger length $L_{F1}$ of switch SW1 may be the same, and in this case, finger number $N_{F3}$ of switch SW3 is higher than finger number $N_{F1}$ of switch SW1. In switch SW1 and switch SW3, the finger lengths and the finger numbers may each differ from each other as long as the gate widths satisfy the above relationships.

As illustrated in (a) of FIG. 2A, in the present embodiment, the stack number of switch SW1 (here, 6) and the stack number of switch SW3 (here, 9) differ from each other. In other words, the stack number of switch SW1 that is the first switch element and the stack number of switch SW3 that is the second switch element are different. To be specific, the stack number of switch SW1 is lower than the stack number of switch SW3. Note that hereinafter, the stack number of the transistor included in a switch may be simply referred to as "stack number of the switch".

In other words, in filter 10 being frequency-tunable through switch SWs1 (first switch element) of series-arm circuit S1 and switch SWp1 (second switch element) of parallel-arm circuit P1, switches SWs1 and SWp1 are designed as follows. Namely, the gate width of switch SWp1 in parallel-arm circuit P1 is designed to be larger than the gate width of switch SWs1 in series-arm circuit S1. The stack number of switch SWs1 is designed to be lower than the stack number of switch SWp1.

This makes it possible to ensure power durability in filter 10, while reducing insertion loss within the passband and scaling down filter 10. This will be described with reference to a relationship between gate width W and switch characteristics and a relationship between stack number Ns and the switch characteristics.

Note that a relationship between the stack number of switch SWs1 in series-arm circuit S1 and the stack number of switch SWp1 in parallel-arm circuit P1 is not limited to the above relationship, and the switches may have, for example, the same stack number. However, the above relationship makes it possible to reduce the total size of switches SWs1 and SWp1, while ensuring individual withstand voltages realizing the power durability that filter 10 requires. As a result, it is possible to ensure power durability, while further reducing insertion loss within the passband and further scaling down filter 10. Accordingly, the stack number of switch SWs1 may be designed to be lower than the stack number of switch SWp1.

Figure 3A:
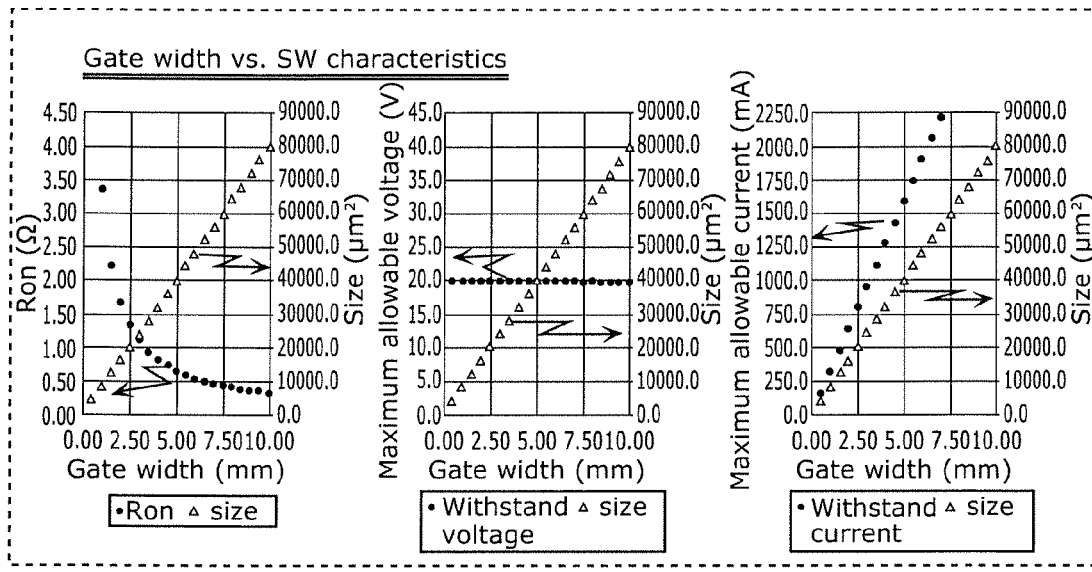
FIG. 3A is a graph showing a relationship between a gate width and switch characteristics of a switch according to Embodiment 1.
Figure 3B:
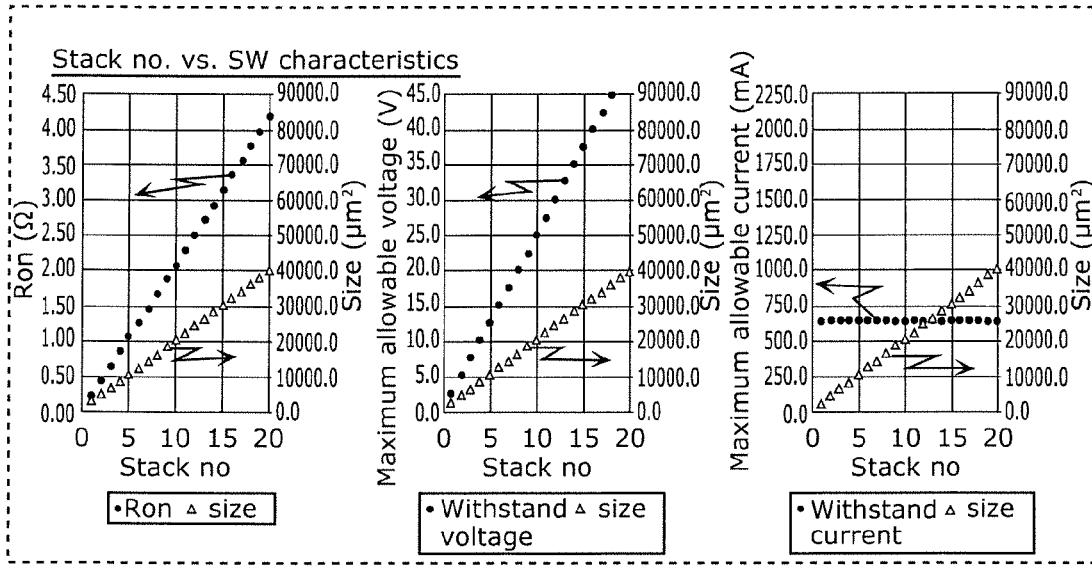
FIG. 3B is a graph showing a relationship between a stack number and the switch characteristics of the switch according to Embodiment 1.

FIG. 3A is a graph showing the relationship between gate width W and the switch characteristics of the switches including transistor 111 when stack number Ns is fixed. FIG. 3B is a graph showing the relationship between stack number Ns and the switch characteristics of the switches including transistor 111 when gate width W is fixed.

As illustrated in the left column of FIG. 3A, when stack number Ns is fixed, ON resistance Ron in the switches decreases with an increase in gate width W. The ON resistance here is the resistance when the switches are conducting. As illustrated in the middle column of FIG. 3A, when stack number Ns is fixed, a withstand voltage (maximum allowable voltage when the switches are not conducting) is fixed without being dependent on gate width W. As illustrated in the right column of FIG. 3A, when stack number Ns is fixed, a withstand current (maximum allowable current when the switches are conducting) increases with an increase in gate width W. As illustrated in the left column, middle column, and right column of FIG. 3A, when stack number Ns is fixed, the size of the switches increases with an increase in gate width W.

Note that when stack number Ns is fixed, the withstand voltage and withstand current of transistor 111 are restricted by the processing limitations and material of transistor 111, since the withstand voltage and withstand current are dependent on a width of source electrode finger 111s and drain electrode finger 111d, and a gap between the electrode fingers. In one transistor 111, a withstand voltage is, for example, approximately 2.5 V and a withstand current with respect to the gate width is approximately 318 mA/mm.

As illustrated in the left column and middle column of FIG. 3B, when gate width W is fixed, ON resistance Ron and a withstand voltage in the switches increases with an increase in stack number Ns. As illustrated in the right column of FIG. 3B, when gate width W is fixed, a withstand current is fixed without being dependent on stack number Ns. As illustrated in the left column, middle column, and right column of FIG. 3B, when gate width W is fixed, the size of the switches increases with an increase in stack number Ns.

In other words, in the switches including transistor 111, the ON resistance decreases with an increase in gate width W, but there is a trade-off relationship in which the size increases. In the switches, the withstand voltage improves with an increase in stack number Ns, but there is a trade-off relationship in which the size increases along with the ON resistance increasing.

Note that even when gate width W is the same, the ON resistance decreases with a decrease in finger length $L_F$ and an increase in finger number $N_F$. This is caused by a resistance component in a longitudinal direction of the electrode fingers decreasing with a decrease in finger length $L_F$. Therefore, a configuration in which finger length $L_F$ is shortened and the finger number is increased when gate width W is fixed makes it possible to improve the withstand current and reduce the ON resistance more compared to a configuration in which finger length $L_F$ is enlarged and the finger number is reduced.

The inventors have gained the following insights from these relationships about the radio-frequency filter being frequency-tunable through switch SWs1 in series-arm circuit S1 and switch SWp1 in parallel-arm circuit P1.

Namely, more current flows to switch SWp1 in parallel-arm circuit P1 than to switch SWs1 in series-arm circuit S1 when the switches are conducting. In other words, switch SWp1 requires a high withstand current, but the withstand current that switch SWs1 requires is not high. It is, therefore, possible to ensure the withstand current and scale down filter 10, by making the gate width of switch SWp1 larger than the gate width of switch SWs1. Since it is possible to reduce the ON resistance of switch SWs1, it is possible to reduce loss when switch SWs1 is conducting.

A greater voltage is applied to switch SWp1 in parallel-arm circuit P1 than to switch SWs1 in series-arm circuit S1 when the switches are not conducting. In other words, switch SWp1 requires a high withstand current, but the withstand current that switch SWs1 requires is not high. It is, therefore, possible to ensure a withstand voltage and scale down filter 10, by making the stack number of switch SWs1 lower than the stack number of switch SWp1. In switch SWs1, compared to switch SWp1, the ON resistance per transistor 111 is high due to the gate width being small, but the stack number is low. This makes it possible to reduce the ON resistance of the entire switch SWs1, the resistance being expressed with a multiplication value of the ON resistance and the stack number per transistor 111. Accordingly, it is possible to reduce insertion loss within the passband of filter 10 when switch SWs1 is conducting.

3) Relationship Between Voltage Across Switch Element and Switch Element Structure The voltage applied to switch SWp1 when switch SWp1 in parallel-arm circuit P1 is not conducting will be described next. Note that hereinafter, the voltage applied to the switch may also be referred to as "voltage across the switch" or "voltage across the switch element".

A magnitude of a voltage across switch SWp1 is proportional to an amount of high-frequency electric power applied to filter 10. Especially when switch SWp1 is not conducting, the voltage across switch SWp1 increases since an impedance of switch SWp1 increases.

In regular switch elements, a stack number of multiple transistors increases and a voltage applied to each transistor is divided. However, the ON resistance of the switch elements increases along with the stack number and size increasing.

In other words, since the size of the switch elements increases upon increasing the stack number of the transistors, the power durability of the filter is improved by improving the withstand voltage of the switch elements, along with increasing the size of the filter. However, since the ON resistance of the switch elements increases upon increasing the stack number of the transistors, insertion loss within the passband of the filter when the switch elements are conducting worsens. In other words, adjusting the stack number of the transistors included in the switch elements leads to a trade-off relationship between (i) the power durability of the filter and (ii) the size and insertion loss within the passband of the filter.

Based on the above standpoint, the filter has the problem of the size increasing and insertion loss within the passband worsening when the stack numbers of the switch elements in the series-arm circuit and the parallel-arm circuit are the same in order to realize the power durability that the radio-frequency filter being frequency-tunable requires.

When looking at the magnitude of the voltage across switch SWp1 in parallel-arm circuit P1, the following can be said. Firstly, voltage Vp1 across switch SWp1 is greater when high-frequency electric power is applied to input/output terminal 102 than when high-frequency electric power is applied to input/output terminal 101. In other words, voltage Vp1 across switch SWp1 increases when high-frequency electric power is applied from input/output terminal 102 that is closer to parallel-arm circuit P1. Secondly, since a high-frequency voltage applied to parallel-arm circuit P1 is divided between parallel-arm resonator p1 and switch circuit Z1, the magnitude of the voltage across switch SWp1 is determined by a divided voltage ratio dependent on an impedance ratio of parallel-arm resonator p1 to switch circuit Z1. Since the impedance of parallel-arm resonator p1 changes greatly through the resonant frequency and the antiresonant frequency, the high-frequency voltage applied to switch circuit Z1 changes through impedance characteristics (i.e., resonance characteristics) of parallel-arm resonator p1.

In other words, the magnitude of voltage Vp1 across switch SWp1 is dependent on (i) from which of input/output terminals 101 and 102 high-frequency electric power is applied (application direction of high-frequency electric power), and (ii) the resonant frequency of parallel-arm resonator p1 (parallel-arm circuit P1).

4) Analysis of Voltage Applied to Switch in Parallel-Arm Circuit

A result of an analysis of how the voltage across switch SWp1 included in the above parallel-arm circuit P1 influences which circuit parameters will be described next.

Figure 4:
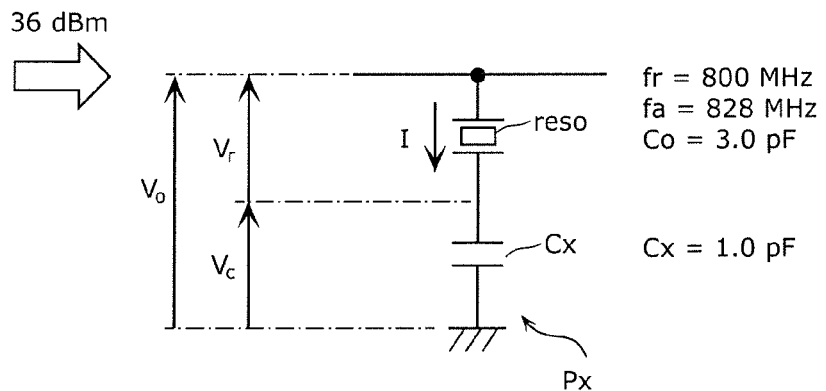
FIG. 4 is an equivalent circuit diagram when a switch of a parallel-arm circuit is not conducting.

FIG. 4 is an equivalent circuit diagram of when switch SWp1 in parallel-arm circuit P1 of filter 10X or parallel-arm circuit Ply of filter 10Y is not conducting. In FIG. 4, parallel-arm circuit Px has a configuration in which resonator reso and capacitor Cx are connected in series. Resonator reso corresponds to parallel-arm resonator p1 in parallel-arm circuit P1 of filter 10X or parallel-arm resonator p1 in parallel-arm circuit Ply of filter 10Y. Capacitor Cx corresponds to (i) an OFF capacitance of switch SWp1 in parallel-arm circuit P1 of filter 10X and a combined capacitance of capacitor Cp1 connected in parallel to switch SWp1, or (ii) an OFF capacitance of switch SWp1 in parallel-arm circuit Ply of filter 10Y. "OFF capacitance of the switch" here is a capacitance component when the switch is not conducting (OFF).

Figure 5:
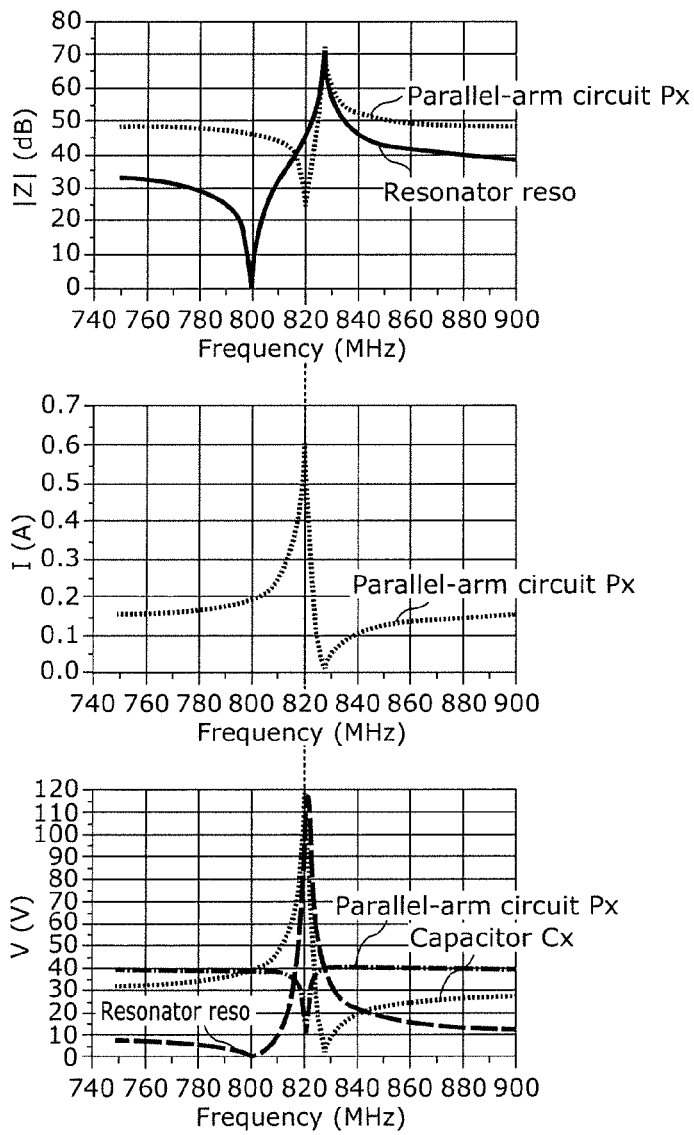
FIG. 5 is a graph showing impedance characteristics, current characteristics, and voltage characteristics of the parallel-arm circuit.

FIG. 5 is a graph showing impedance characteristics, current characteristics, and voltage characteristics of parallel-arm circuit Px. Note that the drawing is not limited to the above characteristics of parallel-arm circuit Px, and the above characteristics of resonator reso and capacitor Cx included in parallel-arm circuit Px may also be illustrated.

As illustrated in the top diagram of FIG. 5, a resonant frequency of parallel-arm circuit Px is higher than a resonant frequency of resonator reso. As illustrated in the middle diagram of FIG. 5, current I that flows in parallel-arm circuit Px is at a maximum at the resonant frequency of parallel-arm circuit Px. This is caused by the impedance of parallel-arm circuit Px being at a local minimum at the resonant frequency of parallel-arm circuit Px. As illustrated in the bottom diagram of FIG. 5, Voltage $V_O$ applied to parallel-arm circuit Px is at a local minimum at the resonant frequency of parallel-arm circuit Px, but (an absolute value of) Voltage $V_C$ applied to capacitor Cx and (an absolute value of) Voltage $V_r$ applied to resonator reso are at a local maximum. In this manner, Voltage $V_C$ and current I of capacitor Cx are at a maximum at the resonant frequency of parallel-arm circuit Px. In other words, a voltage and a current of the above OFF capacitance and the above combined capacitance described as corresponding to capacitor Cx connected in series to resonator reso can be at a maximum at the resonant frequency of parallel-arm circuit Px.

Figure 6A:
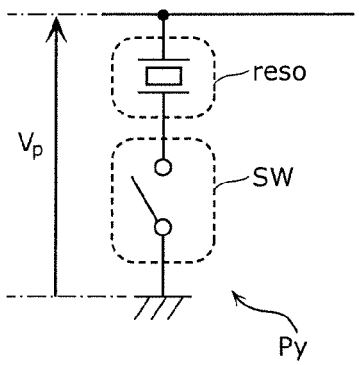
FIG. 6A is a circuit configuration diagram of a parallel-arm circuit.
Figure 6B:
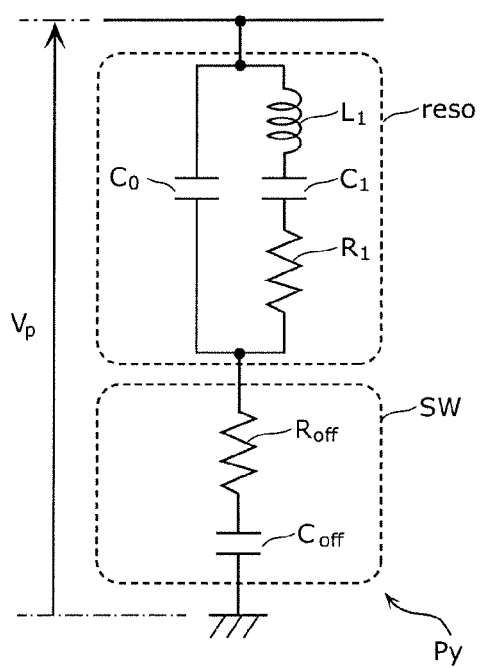
FIG. 6B is an equivalent circuit diagram of the parallel-arm circuit when a switch is not conducting.
Figure 6C:
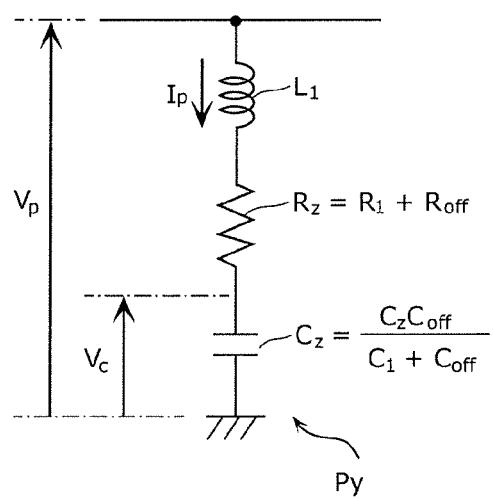
FIG. 6C is an equivalent circuit diagram with respect to a resonant frequency of the parallel-arm circuit when the switch is not conducting.

FIG. 6A is a circuit configuration diagram of parallel-arm circuit Py. FIG. 6B is an equivalent circuit diagram of parallel-arm circuit Py when a switch is not conducting. FIG. 6C is an equivalent circuit diagram with respect to the resonant frequency of parallel-arm circuit Py when the switch is not conducting.

As illustrated in FIG. 6A, parallel-arm circuit Py is a circuit that is constituted by resonator reso and switch SW connected in series. As illustrated in FIG. 6B, resonator reso is expressed as a circuit that is constituted by (i) a series-arm circuit of inductor $L_1$, capacitor $C_1$ and resistor $R_1$, and (ii) electrostatic capacitor $C_0$ of resonator reso connected in parallel. Switch SW is expressed as a circuit that is constituted by resistor $R_{off}$ and OFF capacitor $C_{off}$ connected in series. "Resistor $R_{off}$" here is a resistance component when switch SW is not conducting (OFF). As illustrated in FIG. 6C, the equivalent circuit with respect to the resonant frequency of parallel-arm circuit Py is expressed as a circuit that is constituted by inductor $L_1$, resistor $R_z$, and capacitor $C_z$ connected in series. A resistance value of resistor $R_z$ and a capacitance value of capacitor $C_z$ are respectively expressed with Expression 1 and Expression 2.

[Math. 1]

$$R_Z = R_1 + R_{off} \qquad \text{Expression 1}$$

[Math. 2]

$$C_Z = \frac{C_1 \cdot C_{off}}{C_1 + C_{off}} \qquad \text{Expression 2}$$

Impedance Zp at the resonant frequency of parallel-arm circuit Py is expressed with Expression 3 through the equivalent circuit in FIG. 6C, and current Ip that flows in parallel-arm circuit Py when applying reference voltage Vp to parallel-arm circuit Py is expressed with Expression 4.

[Math. 3]

$$Z_p = R_Z + j\omega_r L_1 + \frac{1}{j\omega_r C_Z} \qquad \text{Expression 3}$$

[Math. 4]

$$I_p = \frac{V_p}{R_Z + j\omega_r L_1 + \frac{1}{j\omega_r C_Z}} \qquad \text{Expression 4}$$

Expression 5 holds true at the antiresonant frequency of parallel-arm circuit Py.

[Math. 5]

$$j\omega_r L_1 = \frac{1}{j\omega_r C_Z} \qquad \text{Expression 5}$$

With this, current Ipr that flows at the resonant frequency of parallel-arm circuit Py is expressed with Expression 6.

[Math. 6]

$$I_{pr} = \frac{V_p}{R_Z} \qquad \text{Expression 6}$$

Voltage Vc applied to capacitor Cz at the resonant frequency of parallel-arm circuit Py is expressed with Expression 7.

[Math. 7]

$$|V_C| = \left| I_p \frac{1}{j\omega_r C_Z} \right| = I_p \frac{1}{\omega_r C_Z} = \frac{V_p}{\omega_r C_Z R_Z} \qquad \text{Expression 7}$$

Since $\omega_r = 1/\sqrt{(L_1 C_Z)}$ at the resonant frequency of parallel-arm circuit Py, Voltage Vc is expressed with Expression 8 upon incorporating this into Expression 7.

[Math. 8]

$$V_C = I_p \frac{V_p}{\frac{1}{\sqrt{L_1 C_Z}} C_Z R_Z} = \frac{V_p \sqrt{L_1 C_Z}}{C_Z R_Z} = \frac{V_p}{R_Z} \sqrt{\frac{L_1}{C_Z}} \qquad \text{Expression 8}$$

Note that a sharpness of a resonance (Q factor) is expressed with Expression 9.

[Math. 9]

$$Q = \frac{1}{R_Z} \sqrt{\frac{L_1}{C_Z}} \qquad \text{Expression 9}$$

Through Expression 8 and Expression 9, Voltage Vc is expressed with Expression 10.

[Math. 10]

$$V_C = Q \cdot V_p \qquad \text{Expression 10}$$

As such, through Expression 10, Voltage Vc applied to capacitor Cz is Q times reference voltage Vp of parallel-arm circuit Py, and a voltage exceeding reference voltage Vp is applied to switch SW in parallel-arm circuit Py when switch SW is OFF.

Figure 6D:
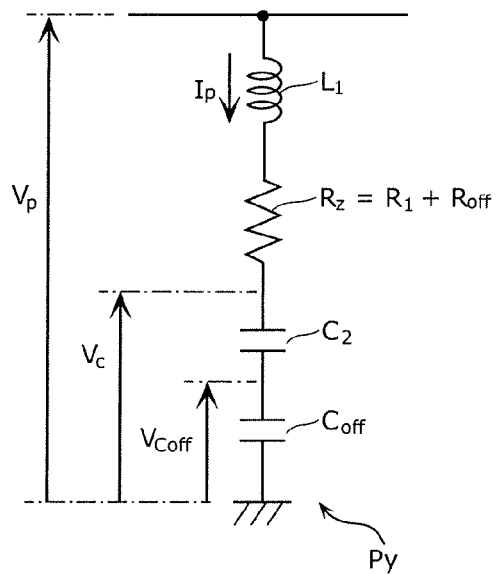
FIG. 6D is an equivalent circuit diagram with respect to the resonant frequency of the parallel-arm circuit when the switch is not conducting.

FIG. 6D is an equivalent circuit diagram with respect to the resonant frequency of parallel-arm circuit Py when switch SW is not conducting. The circuit equivalent circuit shown in FIG. 6D shows capacitor Cz factorized to OFF capacitor $C_{off}$ of switch SW. In this case, Voltage $V_{Coff}$ applied to OFF capacitor $C_{off}$ is expressed with Expression 11, and the voltage applied to OFF capacitor $C_{off}$ of switch SW decreases with a decrease in a capacitance value of OFF capacitor $C_{off}$ of switch SW. The voltage applied to OFF capacitor $C_{off}$ of switch SW decreases with a decrease in the Q factor at the resonant frequency.

[Math. 11]

$$V_{Coff} = \frac{C_{off}}{C_Z} V_C = \frac{C_{off}}{C_1 + C_{off}} V_C = \frac{C_{off}}{C_1 + C_{off}} Q \cdot V_p \qquad \text{Expression 11}$$

A circuit that is constituted by switch SW and capacitor $C_{p1}$ connected in parallel can be conceived with respect to parallel-arm circuit Py.

Figure 6E:
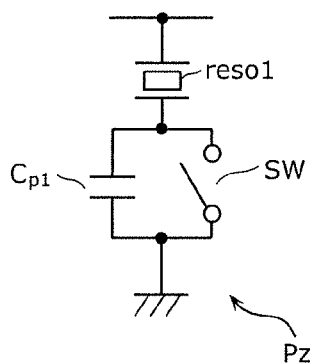
FIG. 6E is a circuit configuration diagram of a parallel-arm circuit.
Figure 6F:
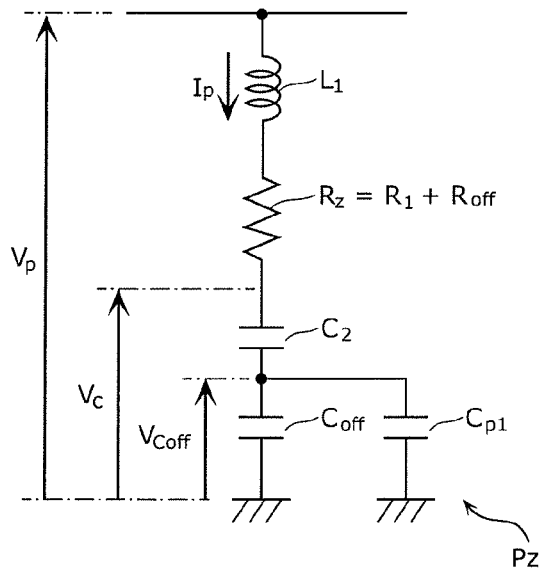
FIG. 6F is an equivalent circuit diagram with respect to a resonant frequency of the parallel-arm circuit when the switch is not conducting.

FIG. 6E is a circuit configuration diagram of parallel-arm circuit Pz. FIG. 6F is an equivalent circuit diagram with respect to the resonant frequency of parallel-arm circuit Pz when switch SW is not conducting.

Resonant frequency fr and antiresonant frequency fa of resonator reso are respectively expressed with Expression 12 and Expression 13 based on an equivalent circuit model of the resonator.

[Math. 12]

$$f_a = f_r \sqrt{1 + \frac{C_1}{C_0}} \qquad \text{Expression 12}$$

[Math. 13]

$$f_r = \frac{1}{2\pi \sqrt{L_1 C_1}} \qquad \text{Expression 13}$$

Voltage $V_{Coff}$ applied to OFF capacitor $C_{off}$ in parallel-arm circuit Pz is expressed with Expression 14 based on an expression in which $C_{off}$ in Expression 11 is replaced with ($C_{off}+C_{p1}$), Expression 12, and Expression 13.

[Math. 14]

$$V_{Coff} = \frac{C_{off} + C_{p1}}{C_0 \left( \left( \frac{f_a}{f_r} \right)^2 - 1 \right) + C_{off} + C_{p1}} Q \cdot V_p \qquad \text{Expression 14}$$

The following can be understood about voltage $V_{Coff}$ of OFF capacitor $C_{off}$ through Expression 14.

(1) Voltage $V_{Coff}$ of OFF capacitor $C_{off}$ of switch SW decreases with an increase in a capacitance value of electrostatic capacitor $C_0$ of resonator reso.
(2) Voltage $V_{Coff}$ of OFF capacitor $C_{off}$ of switch SW decreases with an increase in a capacitance value of capacitor $C_{p1}$.
(3) Voltage $V_{Coff}$ of OFF capacitor $C_{off}$ of switch SW decreases with a decrease in a frequency-tunable range of parallel-arm circuit Pz.
(4) Voltage $V_{Coff}$ of OFF capacitor $C_{off}$ of switch SW decreases with an increase in fractional bandwidth (fa-fr)/fr of resonator reso.

In the above description, the magnitude of voltage Vs across switch SW has been described as being dependent on the high-frequency electric power application direction and the resonant frequency of the parallel-arm resonator. However, as shown in the above analysis result, the magnitude of voltage Vs across switch SW is not limited thereto, and is also dependent on the electrostatic capacitance of the parallel-arm resonator, equivalent capacitance $C_{p1}$ of switch SW, the frequency-tunable range of the parallel-arm circuit, and the fractional bandwidth of the parallel-arm resonator.

5) Examples and Comparative Examples

In the present embodiment described above, the gate width of switch SWp1 is larger than the gate width of switch SWs1 and the stack number of switch SWp1 is higher than the stack number of switch SWs1. This makes it possible to ensure power durability while reducing insertion loss within the passband and scaling down filter 10 being frequency-tunable. Hereinafter, this advantageous effect will be described with reference to Examples 1 and 2 and comparison to Comparative Examples 1 and 2. Comparative Example 1, Comparative Example 2, Example 1, and Example 2 each include the circuit configuration of filter 10X, and are configured similarly except that the high-frequency electric power application direction and design parameters of switches SWp1 and SWs1 differ from one another.

Table 1 shows the differences between Comparative Example 1, Comparative Example 2, Example 1, and Example 2. To be specific, in Comparative Example 1 and Example 1, switches SWs1 and SWp1 are designed to ensure an ability to withstand current and withstand voltage necessary for switches SWs1 and SWp1 when +36 dBm of high-frequency electric power is applied from input/output terminal 101. (In this context, "withstand voltage" and "withstand current" refer to threshold voltage and current parameters to avoid structural damage to the switches). In Comparative Example 2 and Example 2, switches SWs1 and SWp1 are designed to ensure a withstand current and withstand voltage necessary for switches SWs1 and SWp1 when +36 dBm of high-frequency electric power is applied from input/output terminal 102. In Comparative Example 1 and Comparative Example 2, switches SWs1 and SWp1 are configured to have the same (i) gate width taking in consideration a switch that requires the highest withstand current, and (ii) the same stack number taking into consideration a switch that requires the highest withstand voltage. In contrast, in Example 1 and Example 2, the gate widths of switches SWs1 and SWp1 are configured individually to ensure the necessary withstand current, and the stack numbers are configured individually to ensure the necessary withstand voltage.

TABLE 1

|  | Power application terminal | Relationship gate width, stack number |
|---|---|---|
| Comp. Ex. 1 | Input/output terminal 101 | Gate width of switch SWs1 = gate width of switch SWp1<br>Stack number of switch SWs1 = stack number of switch SWp1 |
| Comp. Ex. 2 | Input/output terminal 102 | Gate width of switch SWs1 = gate width of switch SWp1<br>Stack number of switch SWs1 = stack number of switch SWp1 |
| Ex. 1 | Input/output terminal 101 | Gate width of switch SWs1 < gate width of switch SWp1<br>Stack number of switch SWs1 < stack number of switch SWp1 |
| Ex. 2 | Input/output terminal 102 | Gate width of switch SWs1 < gate width of switch SWp1<br>Stack number of switch SWs1 < stack number of switch SWp1 |

The filters according to Comparative Example 1, Comparative Example 2, Example 1, and Example 2 are radio-frequency filters being frequency-tunable (tunable filters) that are capable of changing the frequency of the passband as follows, by switching between conduction (ON) and non-conduction (OFF) of switches SWs1 and SWp1.

Case 1
Switch SWs1 is ON, switch SWp1 is ON
: first passband (700-730 MHz)
Case 2
Switch SWs1 is OFF, switch SWp1 is OFF
: second passband (710-740 MHz)
Case 3
Switch SWs1 is ON, switch SWp1 is OFF
: third passband (710-730 MHz)
Case 4
Switch SWs1 is OFF, switch SWp1 is ON
: fourth passband (700-740 MHz)

Table 2 shows various design parameters shared between the filters according to Comparative Example 1, Comparative Example 2, Example 1, and Example 2. To be specific, this table shows resonant frequencies fr, antiresonant frequencies fa, and electrostatic capacitances of series-arm resonator s1 and parallel-arm resonator p1, and electrostatic capacitances of capacitor Cs1 and capacitor Cp1, as the design parameters.

TABLE 2

|  |  | fr (MHz) | fa (MHz) | Electrostatic capacitance (pF) |
|---|---|---|---|---|
| Series-arm circuit S1 | Series-arm resonator s1 | 725.0 | 779.4 | 3.000 |
|  | Capacitor Cs1 | — | — | 2.200 |
| Parallel-arm circuit P1 | Parallel-arm resonator p1 | 670.0 | 720.3 | 3.000 |
|  | Capacitor Cp1 | — | — | 2.500 |

Hereinafter, the filters according to Comparative Example 1, Comparative Example 2, Example 1, and Example 2 will be described individually.

5.1) Comparative Example 1

Table 3 shows various characteristics of the filter according to Comparative Example 1, maximum current Is_max flowing to each switch, and maximum voltage Vs_max applied to each switch. To be specific, this table shows, per passband, insertion loss IL, and resonant frequencies Fr and antiresonant frequencies Fa of series-arm circuit S1 and parallel-arm circuit P1, as the various characteristics of the filter. The same applies to subsequent tables.

TABLE 3

| Comp. Ex. 1<br>(Power application terminal:<br>input/output terminal 101) |  | IL (dB) | Fr (MHz) | Fa (MHz) | Is_max (mA) | Vs_max (V) |
|---|---|---|---|---|---|---|
| Case 1<br>(SWs1 ON)<br>(SWp1 ON) | Series-arm circuit S1 (switch SWs1) | 0.65 @ 700-730 MHz | 725.0 | 756.7 | 386 | 1.91 |
|  | Parallel-arm circuit P1 (switch SWp1) |  | 669.0 | 720.3 | 593 | 2.89 |
| Case 2<br>(SWs1 OFF)<br>(SWp1 OFF) | Series-arm circuit S1 (switch SWs1) | 0.30 @ 710-740 MHz | 725.0 | 779.4 | 0 | 39.30 |
|  | Parallel-arm circuit P1 (switch SWp1) |  | 697.8 | 720.3 | 0 | 55.55 |
| Case 3<br>(SWs1 ON)<br>(SWp1 OFF) | Series-arm circuit S1 (switch SWs1) | 0.66 @ 710-730 MHz | 725.0 | 779.4 | 385 | 1.90 |
|  | Parallel-arm circuit P1 (switch SWp1) |  | 697.8 | 720.3 | 0 | 57.20 |
| Case 4<br>(SWs1 OFF)<br>(SWp1 ON) | Series-arm circuit S1 (switch SWs1) | 0.31 @ 700-740 MHz | 725.0 | 779.4 | 0 | 39.63 |
|  | Parallel-arm circuit P1 (switch SWp1) |  | 669.0 | 720.3 | 558 | 2.72 |
| Switch SWs1 Max. |  |  |  |  | 386 | 39.63 |
| Switch SWp1 Max. |  |  |  |  | 593 | 57.20 |

Table 4 shows design parameters, characteristics, and size of each switch of the filter according to Comparative Example 1. To be specific, this table shows gate width WF and stack number Ns as the design parameters, and resistance Ron (ON resistance), an allowable input current, and an allowable input voltage when each switch is conducting as the characteristics. The same applies to subsequent tables.

TABLE 4

| Comp. Ex. 1 (Power application terminal: input/output terminal 101) | Gate width WF (mm) | Stack no. Ns (no.) | Ron (Ω) | Allowable input current (mA) | Allowable input voltage (V) | Size (μm²) |
|---|---|---|---|---|---|---|
| Switch SWs1 | 2.10 | 23 | 4.58 | 668 | 57.5 | 48300 |
| Switch SWp1 | 2.10 | 23 | 4.58 | 668 | 57.5 | 48300 |
| Total | 4.20 | 46 | 9.17 | 1335 | 115.0 | 96600 |

Figure 7:
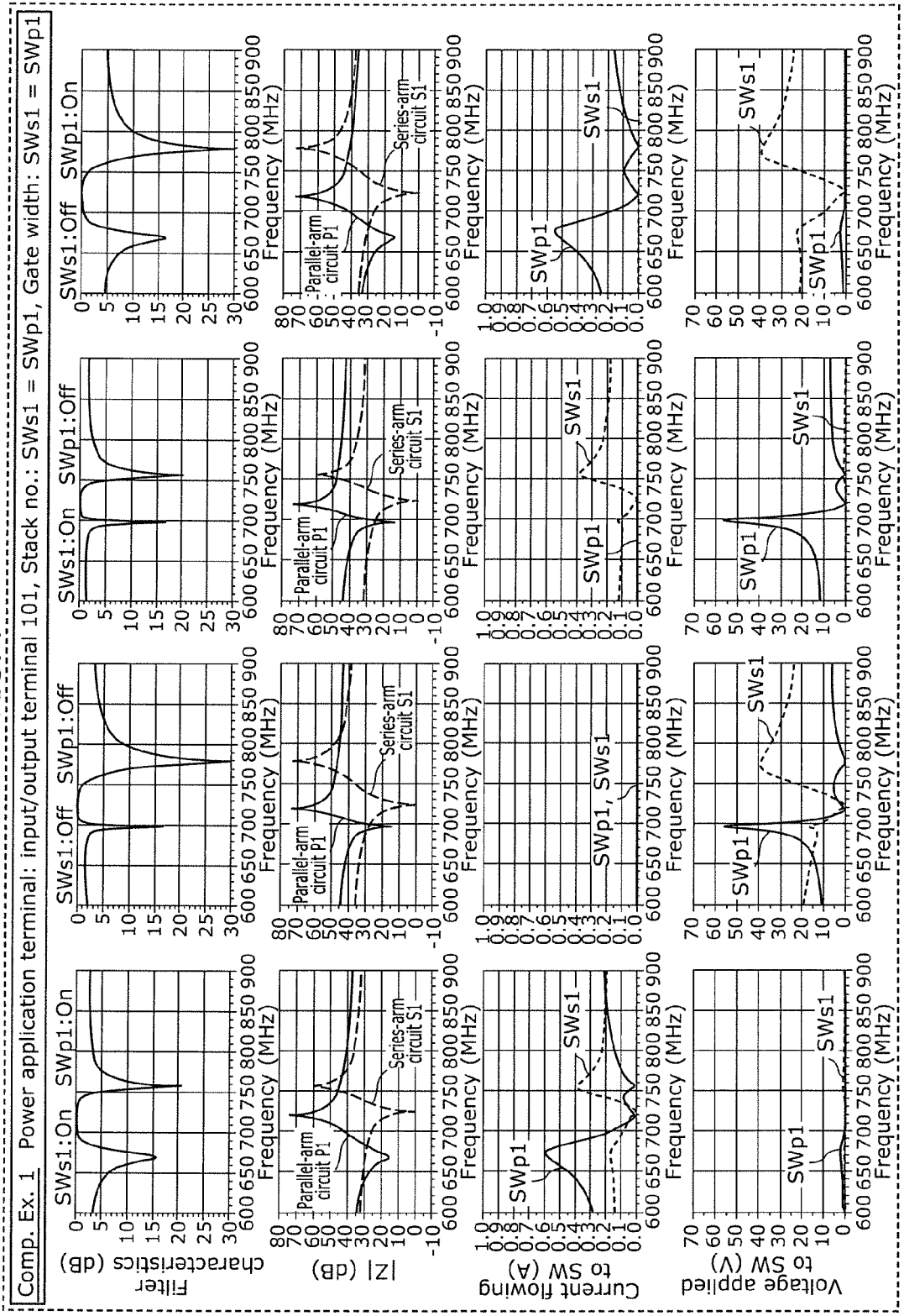
FIG. 7 is a graph showing various characteristics regarding a filter according to Comparative Example 1.

FIG. 7 is a graph showing various characteristics regarding the filter according to Comparative Example 1. To be specific, in the drawing, pass characteristics of the filter are shown on the first row from the top (hereafter referred to as "first row"). Impedance characteristics of series-arm circuit S1 and parallel-arm circuit P1 are shown on the second row from the top (hereafter referred to as "second row"). Characteristics of the current flowing to the switches (switch current characteristics) are shown on the third row from the top (hereafter referred to as "third row"). Characteristics of the voltage applied to the switches (switch voltage characteristics) are shown on the fourth row from the top (hereafter referred to as "fourth row"). The above characteristics when switch SWs1 is ON and switch SWp1 is ON (Case 1) are shown in the first column from the left (hereafter referred to as "first column"). The above characteristics when switch SWs1 is OFF and switch SWp1 is OFF (Case 2) are shown in the second column from the left (hereafter referred to as "second column"). The above characteristics when switch SWs1 is ON and switch SWp1 is OFF (Case 3) are shown in the third column from the left (hereafter referred to as "third column"). The above characteristics when switch SWs1 is OFF and switch SWp1 is ON (Case 4) are shown in the fourth column from the left (hereafter referred to as "fourth column"). The same applies to subsequent graphs showing various characteristics regarding the filter.

5.2) Comparative Example 2

Table 5 shows various characteristics of the filter according to Comparative Example 2, maximum current Is_max flowing to each switch, and maximum voltage Vs_max applied to each switch.

TABLE 6

| Comp. Ex. 2 (Power application terminal: input/output terminal 102) | | IL (dB) | Fr (MHz) | Fa (MHz) | Is_max (mA) | Vs_max (V) |
|---|---|---|---|---|---|---|
| Case 1 (SWs1 ON) (SWp1 ON) | Series-arm circuit S1 (switch SWs1) | 0.65 @ 700-730 MHz | 725.0 | 756.7 | 364 | 1.74 |
| | Parallel-arm circuit P1 (switch SWp1) | | 699.0 | 720.3 | 688 | 3.24 |
| Case 2 (SWs1 OFF) (SWp1 OFF) | Series-arm circuit S1 (switch SWs1) | 0.30 @ 710-740 MHz | 725.0 | 779.4 | 0 | 38.07 |
| | Parallel-arm circuit P1 (switch SWp1) | | 697.8 | 720.3 | 0 | 62.53 |
| Case 3 (SWs1 ON) (SWp1 OFF) | Series-arm circuit S1 (switch SWs1) | 0.65 @ 710-730 MHz | 725.0 | 779.4 | 376 | 1.80 |
| | Parallel-arm circuit P1 (switch SWp1) | | 697.8 | 720.3 | 0 | 62.21 |
| Case 4 (SWs1 OFF) (SWp1 ON) | Series-arm circuit S1 (switch SWs1) | 0.30 @ 700-740 MHz | 725.0 | 779.3 | 0 | 36.21 |
| | Parallel-arm circuit P1 (switch SWp1) | | 699.0 | 720.3 | 701 | 3.30 |
| Switch SWs1 Max. | | | | | 376 | 38.07 |
| Switch SWp1 Max. | | | | | 701 | 62.53 |

Table 6 shows design parameters, characteristics, and size of each switch of the filter according to Comparative Example 2.

TABLE 6

| Comp. Ex. 2 (Power application terminal: input/output terminal 102) | Gate width WF (mm) | Stack no. Ns (no.) | Ron (Ω) | Allowable input current (mA) | Allowable input voltage (V) | Size (μm²) |
|---|---|---|---|---|---|---|
| Switch SWs1 | 2.45 | 26 | 4.44 | 779 | 65.0 | 63700 |
| Switch SWp1 | 2.45 | 26 | 4.44 | 779 | 65.0 | 63700 |
| Total | 4.90 | 52 | 8.88 | 1558 | 130.0 | 127400 |

Figure 8:
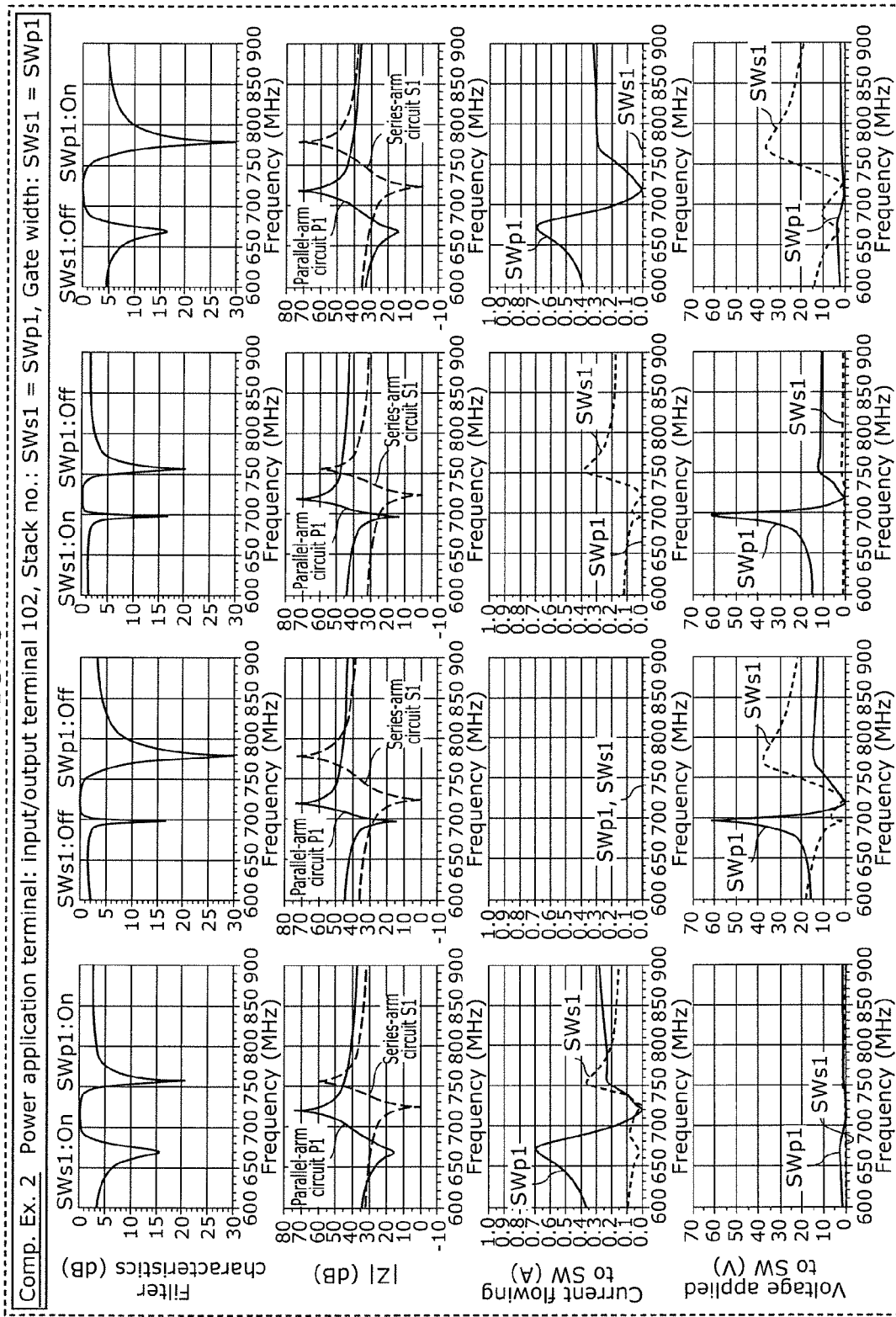
FIG. 8 is a graph showing various characteristics regarding a filter according to Comparative Example 2.

FIG. 8 is a graph showing various characteristics regarding the filter according to Comparative Example 2.

5.3) Example 1

Table 7 shows various characteristics of the filter according to Example 1, maximum current Is_max flowing to each switch, and maximum voltage Vs_max applied to each switch.

TABLE 7

| Ex. 1 (Power application terminal: input/output terminal 101) | | IL (dB) | Fr (MHz) | Fa (MHz) | Is_max (mA) | Vs_max (V) |
|---|---|---|---|---|---|---|
| Case 1 (SWs1 ON) (SWp1 ON) | Series-arm circuit S1 (switch SWs1) | 0.62 @ 700-730 MHz | 725.0 | 756.8 | 393 | 0.92 |
| | Parallel-arm circuit P1 (switch SWp1) | | 669.0 | 720.3 | 594 | 2.89 |
| Case 2 (SWs1 OFF) (SWp1 OFF) | Series-arm circuit S1 (switch SWs1) | 0.30 @ 710-740 MHz | 725.0 | 779.2 | 2 | 39.16 |
| | Parallel-arm circuit P1 (switch SWp1) | | 697.8 | 720.3 | 0 | 55.56 |
| Case 3 (SWs1 ON) (SWp1 OFF) | Series-arm circuit S1 (switch SWs1) | 0.63 @ 710-730 MHz | 725.0 | 779.2 | 391 | 0.91 |
| | Parallel-arm circuit P1 (switch SWp1) | | 697.8 | 720.3 | 0 | 57.28 |
| Case 4 (SWs1 OFF) (SWp1 ON) | Series-arm circuit S1 (switch SWs1) | 0.31 @ 700-740 MHz | 725.0 | 779.4 | 2 | 39.49 |
| | Parallel-arm circuit P1 (switch SWp1) | | 669.0 | 720.3 | 558 | 2.72 |
| Switch SWs1 Max. | | | | | 393 | 39.49 |
| Switch SWp1 Max. | | | | | 594 | 57.28 |

Table 8 shows design parameters, characteristics, and size of each switch of the filter according to Example 1.

TABLE 8

| Ex. 1 (Power application terminal: input/output terminal 101) | Gate width WF (mm) | Stack no. Ns (no.) | Ron (Ω) | Allowable input current (mA) | Allowable input voltage (V) | Size (μm²) |
|---|---|---|---|---|---|---|
| Switch SWs1 | 1.35 | 7 | 2.17 | 429 | 17.5 | 9450 |
| Switch SWp1 | 2.10 | 23 | 4.58 | 668 | 57.5 | 48300 |
| Total | 3.45 | 30 | 6.76 | 1097 | 75.0 | 57750 |

Figure 9:
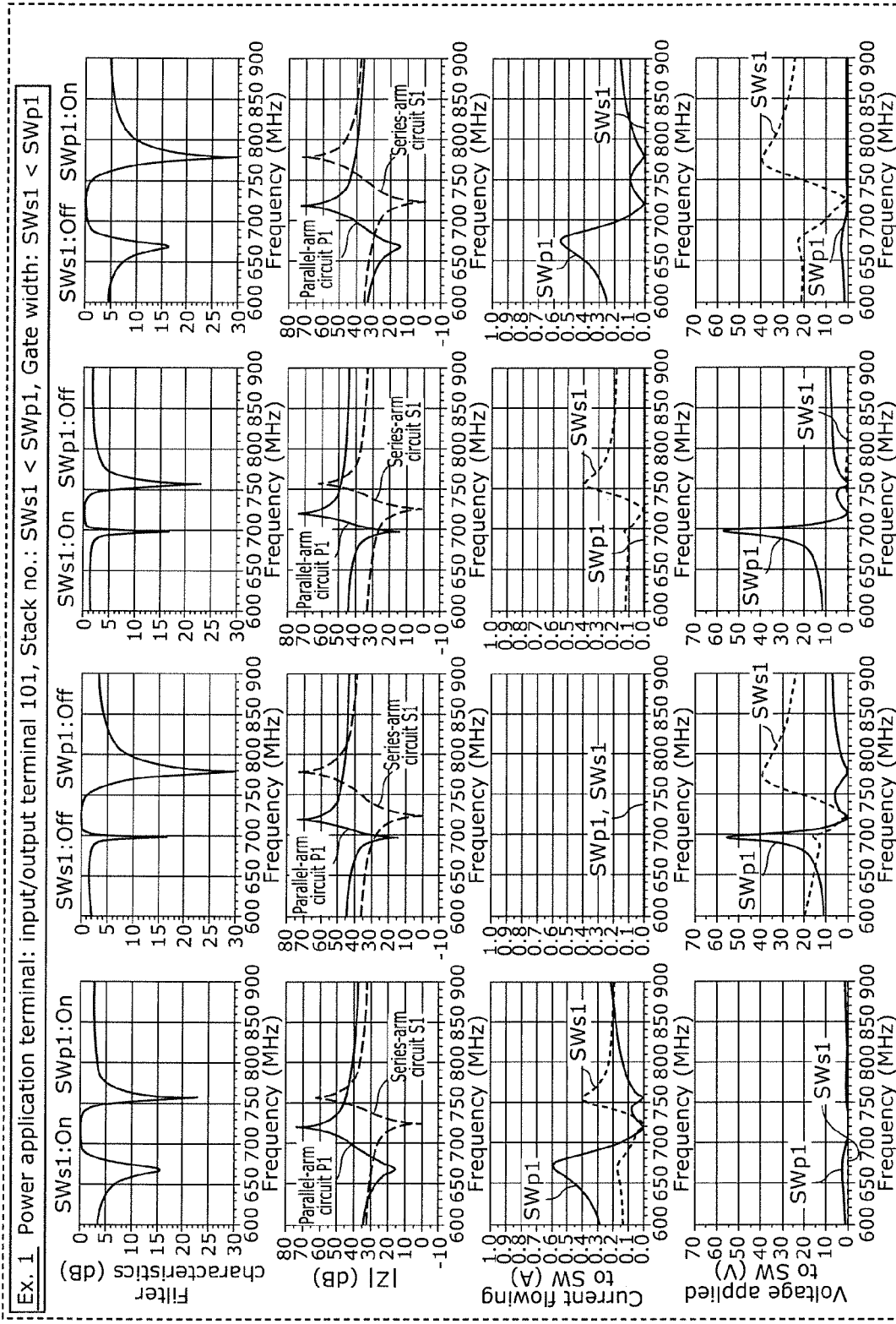
FIG. 9 is a graph showing various characteristics regarding a filter according to Example 1.

FIG. 9 is a graph showing various characteristics regarding the filter according to Example 1.

5.4) Example 2

Table 9 shows various characteristics of the filter according to Example 2, maximum current Is_max flowing to each switch, and maximum voltage Vs_max applied to each switch.

TABLE 9

| Ex. 2 (Power application terminal: input/output terminal 102) | | IL (dB) | Fr (MHz) | Fa (MHz) | Is_max (mA) | Vs_max (V) |
|---|---|---|---|---|---|---|
| Case 1 (SWs1 ON) (SWp1 ON) | Series-arm circuit S1 (switch SWs1) | 0.64 @ 700-730 MHz | 725.0 | 756.7 | 365 | 1.65 |
| | Parallel-arm circuit P1 (switch SWp1) | | 669.0 | 720.3 | 688 | 3.24 |
| Case 2 (SWs1 OFF) (SWp1 OFF) | Series-arm circuit S1 (switch SWs1) | 0.30 @ 710-740 MHz | 725.0 697.8 | 779.4 720.3 | 0 0 | 38.06 62.53 |
| | Parallel-arm circuit P1 (switch SWp1) | | | | | |
| Case 3 (SWs1 ON) (SWp1 OFF) | Series-arm circuit S1 (switch SWs1) | 0.65 @ 710-730 MHz | 725.0 697.8 | 779.3 720.3 | 377 0 | 1.70 62.21 |
| | Parallel-arm circuit P1 (switch SWp1) | | | | | |

TABLE 9-continued

| Ex. 2 (Power application terminal: input/output terminal 102) | | IL (dB) | Fr (MHz) | Fa (MHz) | Is_max (mA) | Vs_max (V) |
|---|---|---|---|---|---|---|
| Case 4 (SWs1 OFF) (SWp1 ON) | Series-arm circuit S1 (switch SWs1) | 0.30 @ 700-740 MHz | 725.0 669.0 | 779.3 720.3 | 0 701 | 36.19 3.30 |
| | Parallel-arm circuit P1 (switch SWp1) | | | | | |
| Switch SWs1 Max. | | | | | 377 | 38.06 |
| Switch SWp1 Max. | | | | | 701 | 62.53 |

Table 10 shows design parameters, characteristics, and size of each switch of the filter according to Example 2.

TABLE 10

| Ex. 2 (Power application terminal: input/output terminal 102) | Gate width WF (mm) | Stack no. Ns (no.) | Ron (Ω) | Allowable input current (mA) | Allowable input voltage (V) | Size (μm²) |
|---|---|---|---|---|---|---|
| Switch SWs1 | 1.60 | 16 | 4.19 | 509 | 40.0 | 9450 |
| Switch SWp1 | 2.45 | 26 | 4.44 | 779 | 65.0 | 48300 |
| Total | 4.05 | 42 | 8.63 | 1287 | 105.0 | 57750 |

Figure 10:
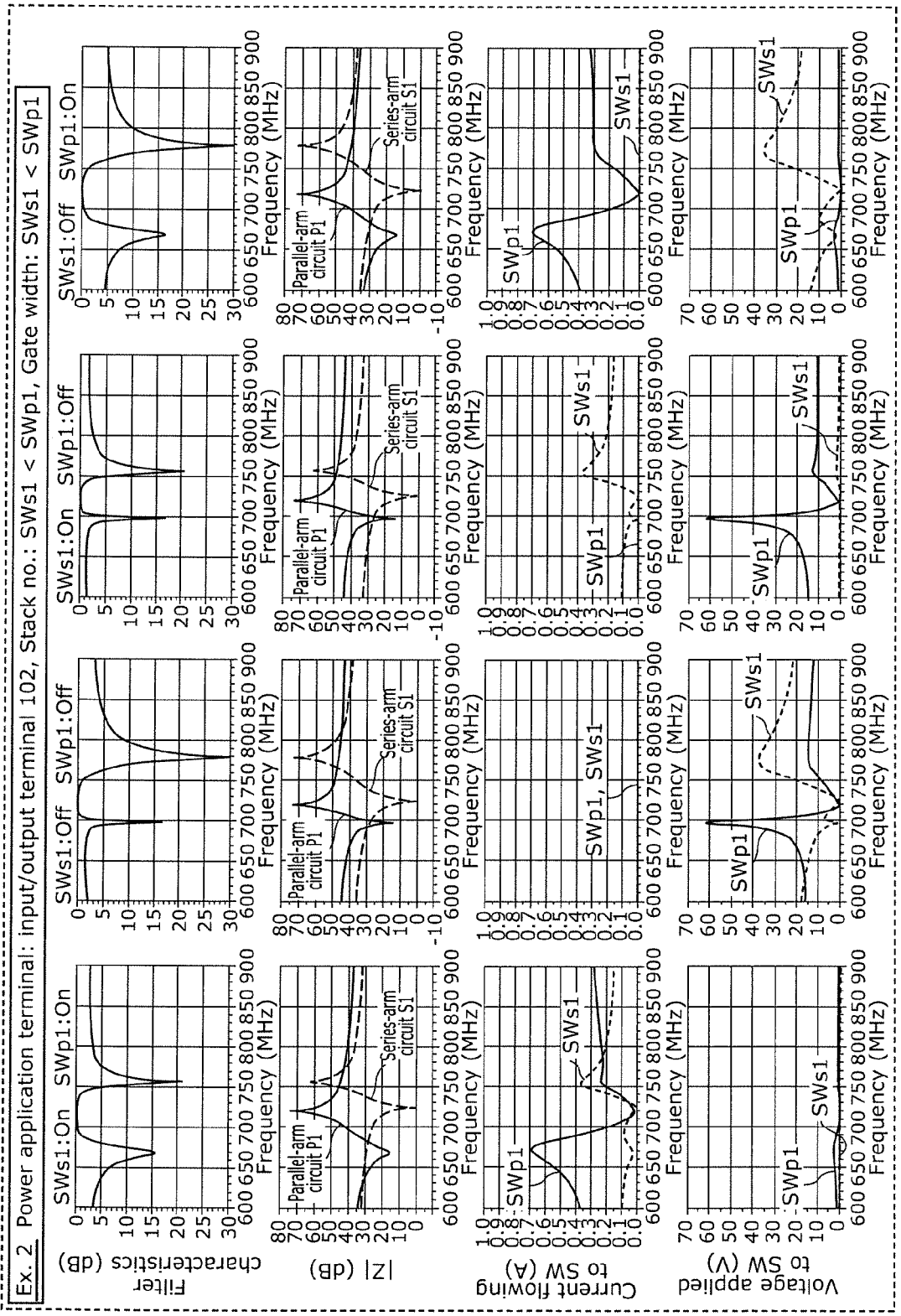
FIG. 10 is a graph showing various characteristics regarding a filter according to Example 2.

FIG. 10 is a graph showing various characteristics regarding the filter according to Example 2.

5.5) Comparison of Examples 1 and 2 with Comparative Examples 1 and 2

As illustrated in FIG. 7 to FIG. 10, table 3, table 5, table 7, and table 9, the resonance characteristics (resonant frequencies and antiresonant frequencies) of series-arm circuit S1 and parallel-arm circuit P1 are substantially the same in the filters according to Comparative Examples 1 and 2 and Examples 1 and 2.

Table 11 shows (i) insertion loss within each passband of the filters according to Comparative Examples 1 and 2 and Examples 1 and 2, and (ii) the total size of the two switches.

TABLE 11

| | IL (dB) | | | | |
|---|---|---|---|---|---|
| | Case 1 (SWs1 ON) (SWp1 ON) @700-730 MHz | Case 2 (SWs1 OFF) (SWp1 OFF) @710-740 MHz | Case 3 (SWs1 ON) (SWp1 OFF) @710-730 MHz | Case 4 (SWs1 OFF) (SWp1 ON) @700-740 MHz | Switch Total Size (μm²) |
| Comp. Ex. 1 | 0.65 | 0.30 | 0.66 | 0.31 | 96600 |
| Comp. Ex. 2 | 0.65 | 0.30 | 0.65 | 0.30 | 127400 |
| Ex. 1 | 0.62 | 0.30 | 0.63 | 0.31 | 57750 |
| Ex. 2 | 0.64 | 0.30 | 0.65 | 0.30 | 89300 |

As illustrated in this table, in Example 1, it is possible to reduce the total size of the switches along with reducing loss within the passband more than in Comparative Example 1. In Example 2, it is similarly possible to reduce the total size of the switches along with reducing loss within the passband more than in Comparative Example 2.

In other words, in series-arm circuit S1, the impedance of switch SWs1 is exceedingly low (ideally zero) when switch SWs1 is ON, and as illustrated in the first column of the third row and the third column of the third row of FIG. 7 to FIG. 10, the current flowing to switch SWs1 is at a maximum at the antiresonant frequency of series-arm circuit S1. However, the impedance of switch SWs1 is exceedingly high (ideally limitless) when switch SWs1 is OFF, and as illustrated in the second column of the fourth row and the fourth column of the fourth row of FIG. 7 to FIG. 10, the voltage applied to switch SWs1 is at a maximum at the antiresonant frequency of series-arm circuit S1.

In parallel-arm circuit P1, the impedance of switch SWp1 is exceedingly low (ideally zero) when switch SWp1 is ON, and as illustrated in the first column of the third row and the third column of the third row of FIG. 7 to FIG. 10, the current flowing to switch SWp1 is at a maximum at the resonant frequency of parallel-arm circuit P1. However, the impedance of switch SWp1 is exceedingly high (ideally limitless) when switch SWp1 is OFF, and as illustrated in the second column of the fourth row and the fourth column of the fourth row of FIG. 7 to FIG. 10, the voltage applied to switch SWp1 is at a maximum at the resonant frequency of parallel-arm circuit P1.

Upon comparing the currents flowing to the switches, a maximum value of the current of switch SWp1 is higher than a maximum value of the current of switch SWs1. Upon comparing the voltages applied to the switches, a maximum value of the voltage of switch SWp1 is higher than a maximum value of the voltage of switch SWs1.

As such, switch SWs1 makes it possible to ensure the necessary withstand current even when reducing the gate width more than the gate width of switch SWp1. Switch SWs1 makes it possible to ensure the necessary withstand voltage even when reducing the stack number more than the stack number of switch SWp1. In this regard, in the switch elements, the ON resistance, which is the resistance component when the switches are conducting, increases with a decrease in the gate width. In switch SWs1, however, since it is possible to reduce the stack number, it is possible to scale down switch SWs1 along with limiting the ON resistance.

In this manner, the voltage applied to switch SWs1 in series-arm circuit S1 is smaller than the voltage applied to switch SWp1 in parallel-arm circuit P1, and less current flows to switch SWs1 in series-arm circuit S1 than to switch SWp1 in parallel-arm circuit P1. Thus, in the filters according to Examples 1 and 2, there is no decrease in power durability even when reducing the stack number and the gate width of switch SWs1 in series-arm circuit S1 more than in the filters according to Comparative Examples 1 and 2. In other words, the filter according to Example 1 makes it possible to scale down the filter and reduce loss while ensuring the necessary withstand current and withstand voltage when +36 dBm of high-frequency electric power is applied from input/output terminal 101. The filter according to Example 2 makes it possible to scale down the filter and reduce loss while ensuring the necessary withstand current and withstand voltage when +36 dBm of high-frequency electric power is applied from input/output terminal 102.

Upon comparing Example 1 in which high-frequency electric power is applied from input/output terminal 101 being close to series-arm circuit S1 with Example 2 in which high-frequency electric power is applied from input/output terminal 102 being close to the node that connects series-arm circuit S1 and parallel-arm circuit P1, in Example 1, it is possible to limit the voltage applied to switch SWp1 more than in Example 2.

In other words, in Example 1 in which high-frequency electric power is applied from input/output terminal 101, since the voltage applied to parallel-arm circuit P1 decreases, the voltage applied to switch SWp1 decreases more than in Example 2 in which the same amount of high-frequency electric power is applied from input/output terminal 102. In this case, in Example 1, it is possible to ensure the necessary withstand voltage, even when reducing the stack number of switch SWp1 more than in Example 2. The filter according to Example 1 therefore makes it possible to further scale down the filter and further reduce loss when switch SWp1 is conducting, since it is possible to reduce the size and the ON resistance of switch SWp1.

6) Summary

Filter 10 according to Embodiment 1 described above using Examples 1 and 2 produces the following advantageous effects (1)-(4). In other words, it is possible to ensure power durability while reducing insertion loss within the passband and scaling down filter 10 being frequency-tunable.

(1) It is possible to scale down filter 10 and further reduce insertion loss within the passband when the switches are conducting along with ensuring the power durability that filter 10 requires, by making the gate width of switch SWp1 in parallel-arm circuit P1 (second switch element) larger than the gate width of switch SWs1 in series-arm circuit S1 (first switch element).

To be specific, the current flowing when switch SWp1 is conducting is greater than the current flowing when switch SWs1 is conducting. Accordingly, it is possible to ensure a withstand current realizing the power durability that the radio-frequency filter requires while reducing the total size of switch SWs1 and switch SWp1, due to the gate width of each of the one or more transistors included in switch SWp1 being larger than the at least one gate width of each of the one or more transistors included in switch SWs1. It is possible to reduce the resistance when switch SWp1 is conducting (ON resistance), due to the gate width of switch SWp1 being relatively large. As such, it is possible to reduce insertion loss within the passband of the radio-frequency filter when switch SWp1 is conducting. It is possible to scale down filter 10, since it is possible to reduce the size of switch SWs1, due to the gate width of switch SWs1 being relatively small. In other words, it is possible to ensure power durability while reducing insertion loss within the passband of the radio-frequency filter being frequency-tunable.

(2) It is possible to further scale down filter 10 and further reduce insertion loss within the passband when the switches are conducting along with ensuring the power durability that filter 10 requires, by making the stack number of switch SWs1 in series-arm circuit S1 lower than the stack number of switch SWp1 in parallel-arm circuit P1.

To be specific, the maximum voltage applied to switch SWs1 is lower than the maximum voltage applied to switch SWp1. Thus, it is possible to scale down switch SWs1 while ensuring a withstand voltage realizing the power durability that the radio-frequency filter requires, by reducing the stack number of switch SWs1. It is possible to limit the resistance when switch SWs1 is conducting, by reducing the stack number of switch SWs1. Thus, it is possible to reduce insertion loss within the passband of the radio-frequency filter when switch SWs1 is conducting. In other words, it is possible to ensure power durability while reducing insertion loss within the passband of the radio-frequency filter being frequency-tunable.

(3) It is possible to further scale down the filter and further reduce insertion loss within the passband when the switches are conducting, since it is possible to reduce the stack of switch SWp1 in parallel-arm circuit P1, by applying electric power from input/output terminal 101 (first input/output terminal) close to series-arm circuit S1.

This makes it possible to reduce a total voltage that is a total amount of the voltages applied when both switch SWs1 and switch SWp1 are not conducting, by applying electric power from input/output terminal 101. Thus, it is possible to reduce the total size of switch SWs1 and switch SWp1 while ensuring the necessary individual withstand voltages, by reducing a total stack number that is a total amount of the stack numbers.

(4) It is possible to change the frequency of the attenuation pole at the low side of the passband (is tunable), by switching between conduction and non-conduction of the switches.

Note that in the above description, the stack number of switch SWs1 is lower than the stack number of switch SWp1, but is not limited thereto as long as the stack number of switch SWs1 differs from the stack number of switch SWp1. For example, the stack number of switch SWs1 may be higher than the stack number of switch SWp1.

Even a filter configured as such makes it possible to reduce the total size of switch SWs1 (first switch element) and switch SWp1 (second switch element), while ensuring the individual withstand voltages, by suitably designing the stack numbers in accordance with the voltage applied when switch SWs1 and switch SWp1 are not conducting. Due to the stack number of one of switch SWs1 and switch SWp1 being relatively lower than the stack number of an other of switch SWs1 and switch SWp1, it is possible to reduce the resistance when the one of switch SWs1 and switch SWp1 is conducting. As such, it is possible to reduce insertion loss within the passband when the one of the switch elements is conducting. In other words, it is possible to ensure power durability while reducing insertion loss within the passband and scaling down filter being frequency-tunable.

The configuration of parallel-arm circuit P1 is not limited to the configuration described in the present embodiment. Hereinafter, filters in which the configuration of parallel-arm circuit P1 differs from Embodiment 1 will be described as variations of Embodiment 1.

7) Variation 1 of Embodiment 1

In filter 10X that is an example of the above-described filter 10, switch circuit Z1 (first switch circuit) is a circuit that is constituted by capacitor Cp1 (second impedance element that is one of an inductor or a capacitor) and switch SWp1 (second switch element) connected in parallel. In contrast, in the present variation, switch circuit Z1 further includes an inductor (third impedance element that is an other of the inductor and the capacitor) connected in series to switch SWp1. Capacitor Cp1 is connected in parallel to the circuit that is constituted by the inductor and switch SWp1 connected in series.

Hereinafter, a filter according to Variation 1 of Embodiment 1 will be described.

Figure 11:
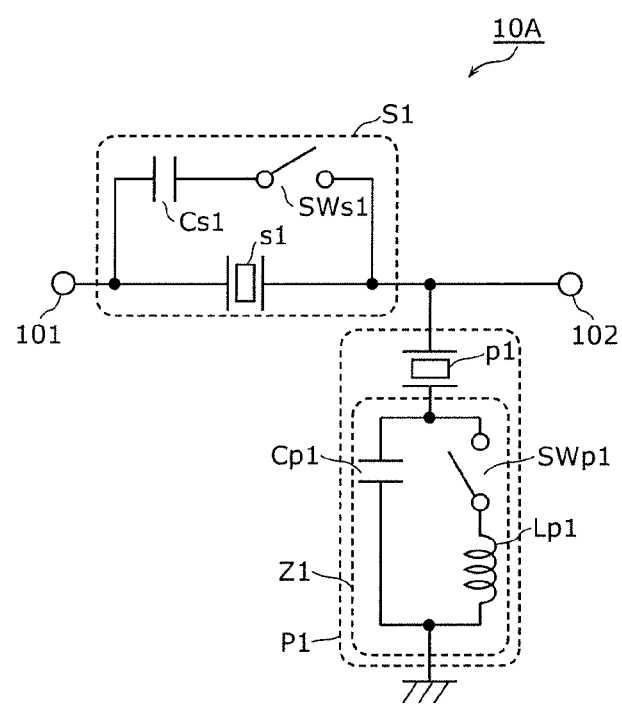
FIG. 11 is a circuit configuration diagram of a filter according to Variation 1 of Embodiment 1.

FIG. 11 is a circuit configuration diagram of filter 10A according to Variation 1 of Embodiment 1. Filter 10A shown in the drawing differs from the above-described filter 10X in that a circuit configuration of switch circuit Z1 is different. Hereinafter, descriptions of filter 10A according to Variation 1 of embodiment 1 that are the same as filter 10X will be omitted and differences will be mainly described.

As illustrated in FIG. 11, filter 10A includes series-arm circuits S1 and S5, parallel-arm circuit P1, and input/output terminals 101 and 102.

Switch circuit Z1 includes capacitor Cp1 (second impedance element), switch SWp1 (second switch element), and inductor Lp1 (third impedance element). Inductor Lp1 is connected in series to switch SWp1, and capacitor Cp1 is connected in parallel to a circuit that is constituted by inductor Lp1 and switch SWp1 connected in series.

In filter 10A configured as such, the resonant frequency of parallel-arm circuit P1 is changed to the high side, by switching switch SWp1 from conduction to non-conduction. When switch SWp1 is conducting, it is possible to cause the resonant frequency of the parallel-arm circuit to be located more toward the low frequency side than the resonant frequency of parallel-arm resonator p1, through inductor Lp1 that is connected in series to switch SWp1. Thus, by switching between conduction and conduction of switch SWp1, it is possible to increase the frequency-tunable range of the frequency of the attenuation pole at the low side of the passband more than with the above-described filter 10X.

In filter 10A according to the present variation, the design parameters of each element other than inductor Lp1 are as stated in Table 2. The magnitude relationship between the gate widths and the magnitude relationship between the stack numbers of switches SWs1 and SWp1 are the same as in Embodiment 1.

Figure 12:
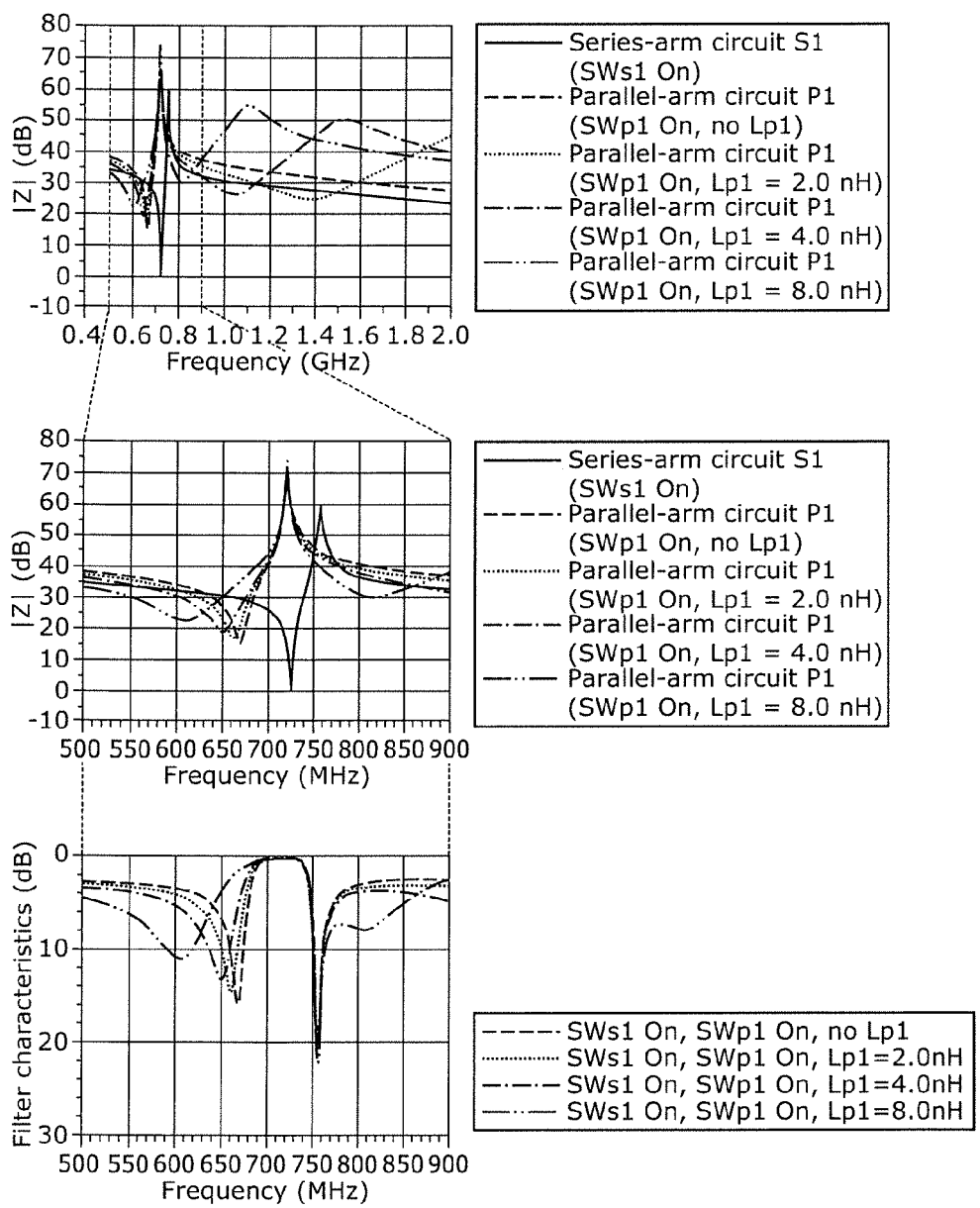
FIG. 12 is a graph showing various characteristics regarding the filter according to Variation 1 of Embodiment 1.

FIG. 12 is a graph showing various characteristics regarding filter 10A according to Variation 1 of Embodiment 1. To be specific, the drawing shows various characteristics when inductor Lp1 has no inductance (when inductor Lp1 is short-circuited) and when an element value of inductor Lp1 is 2.0 nH, 4.0 nH, and 8.0 nH. The first diagram is a graph showing impedance characteristics of series-arm circuit S1 and parallel-arm circuit P1. The second diagram is a graph showing a frequency range of a portion of the impedance characteristics shown in the first diagram exploded. The third diagram is a graph showing filter characteristics.

In the present variation, when switch SWp1 in parallel-arm circuit P1 is conducting, switch circuit Z1 is a circuit that is constituted by capacitor Cp1 and inductor Lp1 connected in parallel. In this case, parallel-arm circuit P1 is a circuit that is constituted by (i) the circuit that is constituted by capacitor Cp1 and inductor Lp1 connected in parallel and (ii) parallel-arm resonator p1 connected in series. Since a frequency, at which the impedance in the circuit constituted by capacitor Cp1 and inductor Lp1 connected in parallel is at a local maximum, is configured to be higher than the resonant frequency of parallel-arm resonator p1, switch circuit Z1 has an inductive impedance at the resonant frequency of parallel-arm resonator p1. Thus, the resonant frequency of parallel-arm circuit P1 is located more toward the low frequency side than the resonant frequency of parallel-arm resonator p1. To be specific, as illustrated in the second diagram and the third diagram of FIG. 12, the resonant frequency of parallel-arm circuit P1 is located more toward the low frequency side with an increase in the element value of inductor Lp1.

On the other hand, when switch SWp1 is not conducting, the impedance of switch SWp1 is exceedingly high (ideally limitless), and inductor Lp1 does not function. Thus, parallel-arm circuit P1 becomes equivalent to a circuit constituted by parallel-arm resonator p1 and capacitor Cp1 connected in series. As such, the resonant frequency of parallel-arm circuit P1 is changed to be located more toward the high frequency side than the resonant frequency of parallel-arm resonator p1.

In other words, in filter 10A according to Variation 1 of Embodiment 1, it is possible to increase the tunable range of the frequency of the attenuation pole at the low side of the passband more than in filter 10X, through inductor Lp1 that is connected in series to switch SWp1. Thus, filter 10A according to Variation 1 of Embodiment 1 makes it possible to ensure a wide tunable range of the passband.

Note that switch circuit Z1 (first switch circuit) is not limited to the above configuration, and may include a plurality of circuits that are constituted by inductor Lp1 (third impedance element) and switch SWp1 (second switch element) connected in series. This plurality of circuits are connected in parallel to one another, and are connected in parallel to capacitor Cp1 (second impedance element). Such a configuration makes it possible to subtly change the frequency of the attenuation pole at the low side of the passband, by suitably switching between conduction and non-conduction of each of the plurality of switches SWp1. In such a configuration, inductance values of multiple inductors Lp1 may differ from one another, and inductance values of at least two inductors Lp1 among the multiple inductors Lp1 may be equal. In either configuration, it is possible to change an inductance value of a combined conductor connected in parallel to capacitor Cp1 in accordance with switch SWp1 that is to conduct. When at least two switches SWp1 are conducting, it is possible to increase a Q factor of the resonant frequency of parallel-arm circuit P1 and to increase selectivity of filter 10A, since multiple switches SWp1 are disposed in parallel, along with improving a Q factor of the combined inductor.

8) Variation 2 of Embodiment 1

A configuration in which one parallel-arm circuit includes one parallel-arm resonator has been described up until this point, but one parallel-arm circuit may also include two parallel-arm resonators. Hereinafter, a filter configured as such according to Variation 2 of Embodiment 1 will be described.

Figure 13:
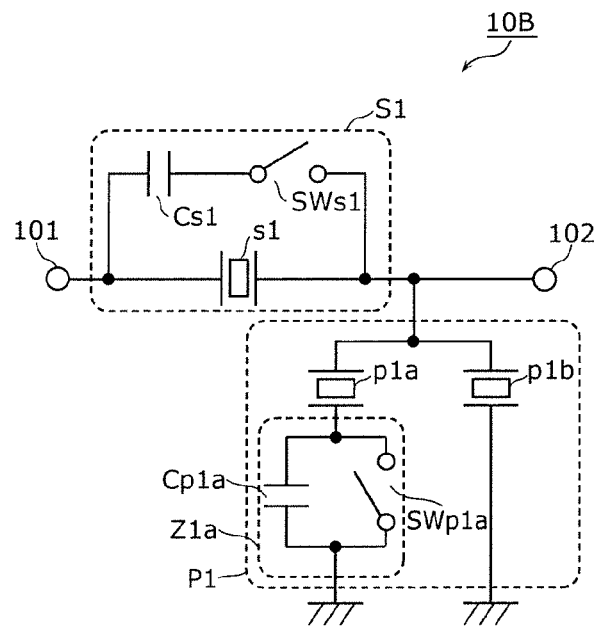
FIG. 13 is a circuit configuration diagram of a filter according to Variation 2 of Embodiment 1.

FIG. 13 is a circuit configuration diagram of filter 10B according to Variation 2 of Embodiment 1. Filter 10B shown in the drawing differs from the above-described filter 10X in that a circuit configuration of switch circuit Z1 is different. Hereinafter, descriptions of filter 10B according to Variation 2 of Embodiment 1 that are the same as filter 10X will be omitted and differences will be mainly described.

Parallel-arm circuit P1 includes parallel-arm resonators p1a and p1b, and switch circuit Z1a connected in series to parallel-arm resonator p1a. A circuit that is constituted by parallel-arm resonator p1a and switch circuit Z1a connected in series, and parallel-arm resonator p1b are connected in parallel between the node and the ground. A resonant frequency of parallel-arm resonator p1b differs from a resonant frequency of parallel-arm resonator p1a, and an antiresonant frequency of parallel-arm resonator p1b differs from an antiresonant frequency of parallel-arm resonator p1a.

Parallel-arm resonator p1a, capacitor Cp1a, Switch SWp1a, and switch circuit Z1a respectively correspond to parallel-arm resonator p1, capacitor Cp1, Switch SWp1, and switch circuit Z1 in filter 10X. In other words, parallel-arm circuit P1 of filter 10B further includes, compared to parallel-arm circuit P1 of filter 10X, parallel-arm resonator p1b (second parallel-arm resonator) connected in parallel to a circuit constituted by parallel-arm resonator p1a (first parallel-arm resonator) and switch circuit Z1a (first switch circuit) connected in series.

When the resonant frequency of parallel-arm resonator p1a is lower than the resonant frequency of parallel-arm resonator p1b, a pass characteristic of filter 10B is that an attenuation slope at the low side of the passband changes to the high side while maintaining a steepness thereof, by switching switch SWp1a from conduction to non-conduction. In other words, the filter is capable of changing the frequency at the low end of the passband and the frequency of the attenuation band to the high side while limiting an increase in insertion loss at the low end of the passband. In other words, it is possible to change the frequency of the attenuation pole at the low side of the passband, without needing to worsen insertion loss within the passband.

When the resonant frequency of parallel-arm resonator p1a is higher than the resonant frequency of parallel-arm resonator p1b, a pass characteristic of filter 10B is that an attenuation slope at the high side of the passband is changed to the high side while maintaining a steepness thereof, by switching switch SWp1a from conduction to non-conduction. In other words, the filter is capable of changing the frequency at the high end of the passband and the frequency of the attenuation band to the high side while limiting an increase in insertion loss at the high end of the passband. In other words, it is possible to change the frequency of the attenuation pole at the high side of the passband, without needing to worsen insertion loss within the passband.

In the present variation, among parallel-arm resonator p1a and parallel-arm resonator p1b, an electrostatic capacitance of parallel-arm resonator p1a connected in series to switch circuit Z1a may be greater than an electrostatic capacitance of parallel-arm resonator p1b.

In other words, switch SWp1a (second switch element) is included in switch circuit Z1a (first switch circuit) connected in series to parallel-arm resonator p1a. Thus, the voltage applied to an OFF capacitor, which is a capacitance component of switch SWp1a, when the second switch element is not conducting, is dependent on the electrostatic capacitance of parallel-arm resonator p1a, and, to be specific, decreases with an increase in the electrostatic capacitance of parallel-arm resonator p1a (see the column "4) Analysis of Voltage Applied to Switch in Parallel-Arm Circuit"). Accordingly, by making the electrostatic capacitance of parallel-arm resonator p1a greater than the electrostatic capacitance of parallel-arm resonator p1b, it is possible to reduce the stack number of switch SWp1a, since it is possible to lower the voltage applied to switch SWp1a. It is, therefore, possible to scale down switch SWp1a while ensuring a withstand voltage.

9) Variation 3 of Embodiment 1 (Example 3)

Figure 14:
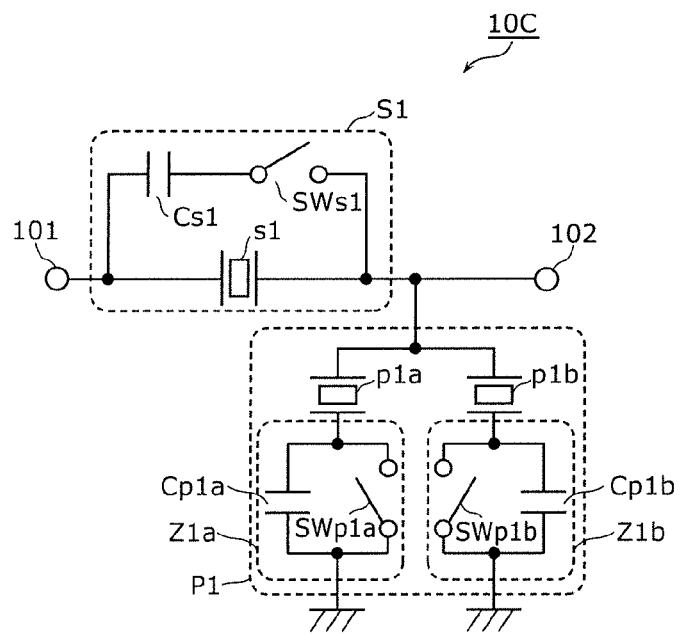
FIG. 14 is a circuit configuration diagram of a filter according to Variation 3 of Embodiment 1.

FIG. 14 is a circuit configuration diagram of filter 10C according to Variation 3 of Embodiment 1. Filter 10C shown in the drawing differs from filter 10B in that parallel-arm circuit P1 includes two circuits each constituted by a parallel-arm resonator and a switch circuit connected in series, and that these two circuits are connected in parallel. Hereinafter, descriptions of filter 10C according to Variation 3 of Embodiment 1 that are the same as filter 10B will be omitted and differences will be mainly described.

Parallel-arm circuit 21 includes parallel-arm resonators p1a and p1b, switch circuit Z1a connected in series to parallel-arm resonator p1a, and switch circuit Z1b connected in series to parallel-arm resonator p1b. A circuit that is constituted by parallel-arm resonator p1a and switch circuit Z1a connected in series and a circuit that is constituted by parallel-arm resonator p1b and switch circuit Z1b connected in series are connected in parallel. Switch circuit Z1b includes capacitor Cp1b and switch SWp1b. Switch SWp1b is connected in parallel to capacitor Cp1b. Note that switch circuit Z1b may include an inductor instead of capacitor Cp1. A resonant frequency of parallel-arm resonator p1b differs from a resonant frequency of parallel-arm resonator p1a, and an antiresonant frequency of parallel-arm resonator p1b differs from an antiresonant frequency of parallel-arm resonator p1a. To be specific, the resonant frequency of parallel-arm resonator p1b is lower than the resonant frequency of parallel-arm resonator p1a, and the antiresonant frequency of parallel-arm resonator p1b is lower than the antiresonant frequency of parallel-arm resonator p1a.

In filter 10C configured as such, a pass characteristic of filter 10C is that the passband is changed to the high side while an attenuation slope at the low side of the passband maintains a steepness thereof and an attenuation slope at the high side of the passband maintains a steepness thereof, by respectively switching switch SWp1a and switch SWp1b from conduction to non-conduction. In other words, in filter 10C, it is possible to change the passband to the high side while limiting an increase in insertion loss at the low end of the passband, and at the same time change the attenuation pole at the low side of the passband to the high side and the attenuation pole at the high side of the passband to the high side, by switching each switch from conduction to non-conduction. On the other hand, it is possible to change the passband to the low side while limiting an increase in insertion loss at the high end of the passband, and at the same time change the attenuation pole at the low side of the passband to the low side and the attenuation pole at the high side of the passband to the low side, by switching each switch from non-conduction to conduction. In other words, it is possible to change the frequency of the attenuation pole at the low side of the passband and the high side of the passband, without needing to worsen insertion loss within the passband.

Switch SWp1b includes one or more transistors, similar to switches SWs1 and SWp1a. In this manner, switches SWs1, SWp1a, and SWp1b that make filter 10C frequency-tunable are designed as follows. Switches SWs1, SWp1a, and SWp1b are each described here as including at least one having the same configuration, for the sake of brevity.

Gate width of switch SWs1<gate width of switch SWp1a
Gate width of switch SWs1<gate width of switch SWp1b
Stack number of switch SWp1b>stack number of switch SWs1>stack number of switch SWp1a This makes it possible to also ensure power durability in filter 10C, while reducing insertion loss within the passband and scaling down filter 10C. Hereinafter, this advantageous effect will be described with reference to Example 3 and comparison to Comparative Example 3. Comparative Example 3 and Example 3 each include the circuit configuration of filter 10C, and are configured similarly except that the design parameters of switches, SWp1a, SWp1b and SWs1 differ from one another.

To be specific, in Comparative Example 3 and Example 3, switches SWs1, SWp1a, and SWp1b are designed to ensure a withstand current and withstand voltage necessary for switches SWs1, SWp1a, and SWp1b when +36 dBm of high-frequency electric power is applied from input/output terminal 102. In Comparative Example 3, switches SWs1, SWp1a, and SWp1b are configured to have the same (i) gate width taking in consideration the switch that requires the highest withstand current, and (ii) the same stack number taking into consideration the switch that requires the highest withstand voltage. In contrast, in Example 3, the gate widths of switches SWs1, SWp1a, and SWp1b are configured individually to ensure the necessary withstand current, and the stack numbers are configured individually to ensure the necessary withstand voltage.

Note that in filter 10B according to Variation 2 of Embodiment 1, parallel-arm resonator p1a connected in series to switch circuit Z1a (first switch circuit) is described as the first parallel-arm resonator, and parallel-arm resonator p1b not connected in series to the switch circuit is described as the second parallel-arm resonator. However, in filter 10C according to the present variation, among parallel-arm resonator p1a and parallel-arm resonator p1b, a parallel-arm resonator with the highest resonant frequency and antiresonant frequency (here, parallel-arm resonator p1b) is the first parallel-arm resonator, and a parallel-arm resonator with the lowest resonant frequency and antiresonant frequency (here, parallel-arm resonator p1a) is the second parallel-arm resonator. As such, in the present variation, among switch circuits Z1a and Z1b, a switch circuit connected in series to the parallel-arm resonator with the highest resonant frequency and antiresonant frequency (here, switch circuit Z1b) is the first switch circuit, and a switch circuit connected in series to the parallel-arm resonator with the lowest resonant frequency and antiresonant frequency (here, switch circuit Z1a) is the second switch circuit. In other words, a switch element (here, switch SWp1b) and an impedance element (here, capacitor Cp1b) included in a switch circuit connected in series to the parallel-arm resonator with the highest resonant frequency and antiresonant frequency are respectively the second switch element and the third impedance element. A switch element (here, switch SWp1a) and an impedance element (here, capacitor Cp1a) included in a switch circuit connected in series to the parallel-arm resonator with the lowest resonant frequency and antiresonant frequency are respectively the third switch element and the fourth impedance element.

The filters according to Comparative Example 3 and Example 3 are radio-frequency filters being frequency-tunable (tunable filters) that are capable of changing the frequency of the passband as follows, by switching between conduction (ON) and non-conduction (OFF) of switches SWs1, SWp1a, and SWp1b.

Case 1
switch SWs1 is ON, switch SWp1a is ON, switch SWp1b is ON
: first passband (705-725 MHz)
Case 2
switch SWs1 is OFF, switch SWp1a is OFF, switch SWp1b is OFF
: second passband (710-735 MHz)
Case 3
switch SWs1 is ON, switch SWp1a is OFF, switch SWp1b is ON
: third passband (710-725 MHz)

Case 4 switch SWs1 is OFF, switch SWp1*a* is ON, switch SWp1*b* is OFF
: fourth passband (705-735 MHz)

Table 12 shows various design parameters shared between the filters according to Comparative Example 3 and Example 3. To be specific, this table shows resonant frequencies fr, antiresonant frequencies fa, and electrostatic capacitances of series-arm resonator s1 and parallel-arm resonators p1*a* and p1*b*, and electrostatic capacitances of capacitor Cs1 and capacitors Cp1*a* and Cp1*b* as the design parameters.

TABLE 12

| | | fr (MHz) | fa (MHz) | Electrostatic capacitance (pF) |
|---|---|---|---|---|
| Series-arm circuit S1 | Series-arm resonator s1 | 725.0 | 757.6 | 3.000 |
| | Capacitor Cs1 | — | — | 2.000 |
| Parallel-arm circuit P1 | Parallel-arm resonator p1*a* | 680.0 | 731.0 | 3.000 |
| | Capacitor Cp1*a* | — | — | 7.000 |

TABLE 12-continued

| | fr (MHz) | fa (MHz) | Electrostatic capacitance (pF) |
|---|---|---|---|
| Parallel-arm resonator p1*b* | 740.0 | 795.5 | 0.500 |
| Capacitor Cp1*b* | — | — | 3.000 |

Hereinafter, the filters according to Comparative Example 3 and Example 3 will be described individually.

9.1) Comparative Example 3

Table 13 shows various characteristics of the filter according to Comparative Example 3, maximum current Is_max flowing to each switch, and maximum voltage Vs_max applied to each switch. To be specific, this table shows, per passband, insertion loss IL, resonant frequency Fr1 and antiresonant frequency Fa1 of series-arm circuit S1, and resonant frequencies Fr1 and Fr2 and antiresonant frequencies Fa1 and Fa2 of parallel-arm circuit P1, as the various characteristics of the filter. The same applies to subsequent tables.

TABLE 13

| Comp. Ex. 3 (power application terminal: input/output terminal 102) | | IL (dB) | Fr1 (MHz) | Fa1 (MHz) | Fr2 (MHz) | Fa2 (MHz) | Is_max (mA) | Vs_max (V) |
|---|---|---|---|---|---|---|---|---|
| Case 1 (SWs1 ON) (SWp1a ON) (SWp1b ON) | Series-arm circuit S1 (switch SWs1) | 0.55 @ 705-725 MHz | 725.0 | 744.7 | — | — | 307 | 1.08 |
| | Parallel-arm circuit P1 (top row: switch SWp1a) (bottom row: switch SWp1b) | | 679.3 | 713.5 | 739.8 | 758.0 | 745<br>708 | 2.58<br>2.48 |
| Case 2 (SWs1 OFF) (SWp1a OFF) (SWp1b OFF) | Series-arm circuit S1 (switch SWs1) | 0.45 @ 710-735 MHz | 725.0 | 757.6 | — | — | 0 | 37.90 |
| | Parallel-arm circuit P1 (top row: switch SWp1a) (bottom row: switch SWp1b) | | 695.7 | 718.7 | 748.2 | 762.6 | 0<br>0 | 25.59<br>51.02 |
| Case 3 (SWs1 ON) (SWp1a OFF) (SWp1b ON) | Series-arm circuit S1 (switch SWs1) | 0.54 @ 710-725 MHz | 725.0 | 744.7 | — | — | 308 | 1.08 |
| | Parallel-arm circuit P1 (top row: switch SWp1a) (bottom row: switch SWp1b) | | 695.7 | 715.4 | 739.8 | 759.4 | 0<br>709 | 25.45<br>2.48 |
| Case 4 (SWs1 OFF) (SWp1a ON) (SWp1b OFF) | Series-arm circuit S1 (switch SWs1) | 0.49 @ 705-735 MHz | 725.0 | 757.6 | — | — | 0 | 37.67 |
| | Parallel-arm circuit P1 (top row: switch SWp1a) (bottom row: switch SWp1b) | | 679.3 | 717.4 | 748.2 | 761.3 | 758<br>0 | 2.63<br>50.98 |
| Switch SWp1 Max. | | | | | | | 308 | 37.90 |
| Switch SWp1a Max. | | | | | | | 758 | 25.59 |
| Switch SWp1b Max. | | | | | | | 709 | 51.02 |

Table 14 shows design parameters, characteristics, and size of each switch of the filter according to Comparative Example 3.

TABLE 14

| Comp. Ex. 3 (Power application terminal: input/output terminal 102) | Gate width WF (mm) | Stack no. Ns (no.) | Ron (Ω) | Allowable input current (mA) | Allowable input voltage (V) | Size (μm²) |
|---|---|---|---|---|---|---|
| Switch SWs1 | 2.70 | 21 | 3.26 | 858 | 52.5 | 56700 |
| Switch SWs1a | 2.70 | 21 | 3.26 | 858 | 52.5 | 56700 |
| Switch SWp1 | 2.70 | 21 | 3.26 | 858 | 52.5 | 56700 |
| Total | 8.10 | 63 | 9.77 | 2575 | 157.5 | 170100 |

Figure 15:
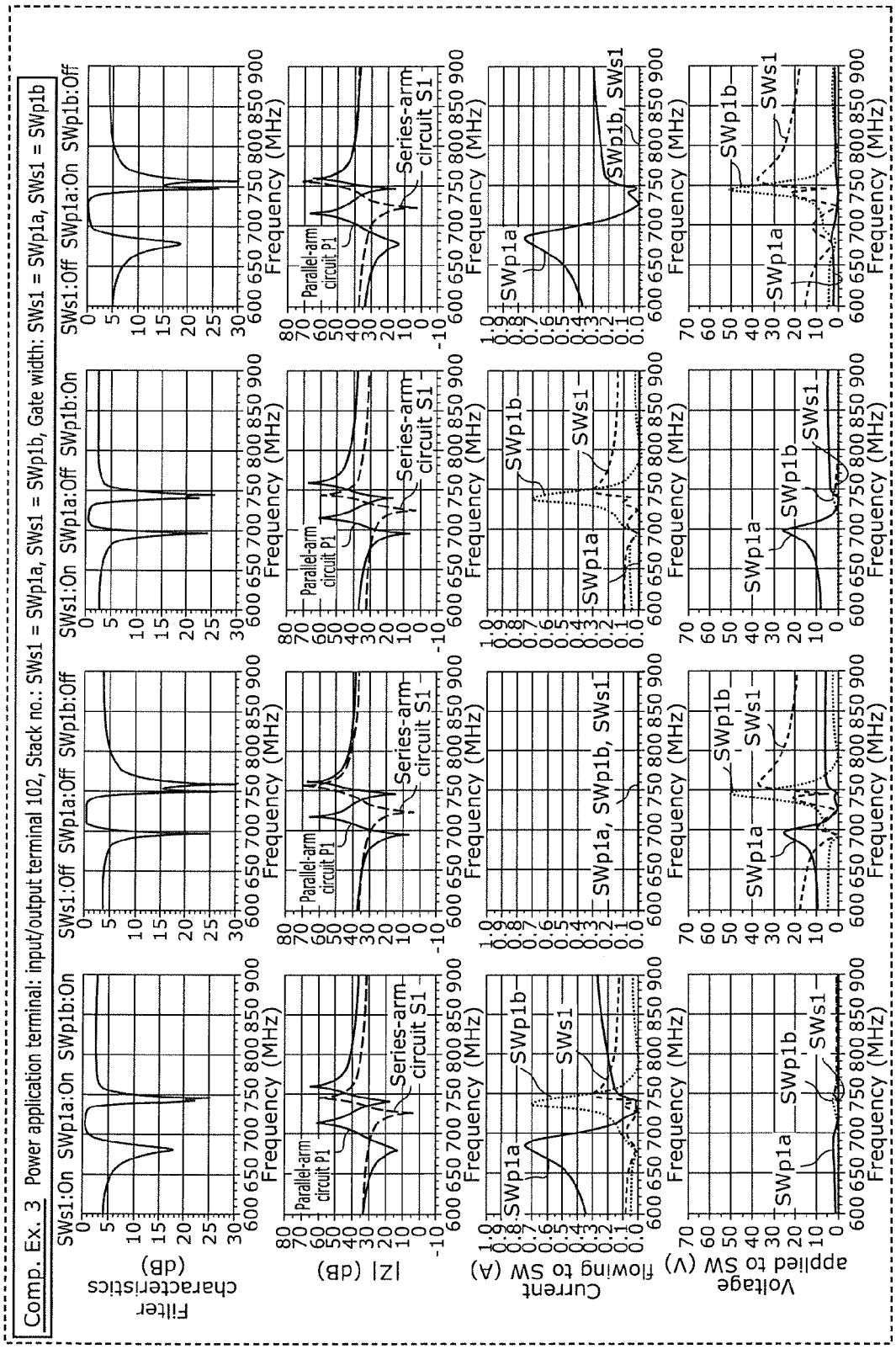
FIG. 15 is a graph showing various characteristics regarding a filter according to Comparative Example 3.

FIG. 15 is a graph showing various characteristics regarding the filter according to Comparative Example 3. To be specific, in the drawing, pass characteristics of the filter are shown in the first row. Impedance characteristics of series-arm circuit S1 and parallel-arm circuit P1 are shown in the second row. Characteristics of the current flowing to the switches (switch current characteristics) are shown in the third row. Characteristics of the voltage applied the switches (switch voltage characteristics) are shown in the fourth row. In the drawing, the above characteristics when switch SWs1 is ON, switch SWp1a is ON, and switch SW1b is ON (Case 1) are shown in the first column. The above characteristics when switch SWs1 is OFF, switch SWp1a is OFF, and switch SWp1b is OFF (Case 2) are shown in the second column. The above characteristics when switch SWs1 is ON, switch SWp1a is OFF, and switch SWp1b is OFF (Case 3) are shown in the third column. The above characteristics when switch SWs1 is OFF, switch SWp1a is ON, and switch SWp1b is OFF (Case 4) are shown in the fourth column. The same applies to subsequent graphs showing various characteristics regarding the filter.

9.2) Example 3

Table 15 shows various characteristics of the filter according to Example 3, maximum current Is_max flowing to each switch, and maximum voltage Vs_max applied to each switch.

TABLE 15

| Ex. 3 (power application terminal: input/output terminal 102) | | IL (dB) | Fr1 (MHz) | Fa1 (MHz) | Fr2 (MHz) | Fa2 (MHz) | Is_max (mA) | Vs_max (V) |
|---|---|---|---|---|---|---|---|---|
| Case 1 (SWs1 ON) (SWp1a ON) (SWp1b ON) | Series-arm circuit S1 (switch SWs1) | 0.54 @ 705-725 MHz | 725.0 | 744.7 | — | — | 307 | 1.06 |
| | Parallel-arm circuit P1 (top row: switch SWp1a) (bottom row: switch SWp1b) | | 679.6 | 713.5 | 739.8 | 758.0 | 780 707 | 1.41 2.52 |
| Case 2 (SWs1 OFF) (SWp1a OFF) (SWp1b OFF) | Series-arm circuit S1 (switch SWs1) | 0.46 @ 710-735 MHz | 725.0 | 757.6 | — | — | 0 | 37.88 |
| | Parallel-arm circuit P1 (top row: switch SWp1a) (bottom row: switch SWp1b) | | 695.7 | 718.7 | 748.2 | 762.6 | 1 0 | 25.57 51.03 |
| Case 3 (SWs1 ON) (SWp1a OFF) (SWp1b ON) | Series-arm circuit S1 (switch SWs1) | 0.54 @ 710-725 MHz | 725.0 | 744.7 | — | — | 308 | 1.06 |
| | Parallel-arm circuit P1 (top row: switch SWp1a) (bottom row: switch SWp1b) | | 695.7 | 715.4 | 739.8 | 759.4 | 1 708 | 25.43 2.52 |
| Case 4 (SWs1 OFF) (SWp1a ON) (SWp1b OFF) | Series-arm circuit S1 (switch SWs1) | 0.46 @ 705-735 MHz | 725.0 | 757.6 | — | — | 0 | 37.74 |
| | Parallel-arm circuit P1 (top row: switch SWp1a) (bottom row: switch SWp1b) | | 679.3 | 717.4 | 748.2 | 761.3 | 791 0 | 1.43 50.99 |
| Switch SWp1 Max. | | | | | | | 308 | 37.88 |
| Switch SWp1a Max. | | | | | | | 791 | 25.57 |
| Switch SWp1b Max. | | | | | | | 708 | 51.03 |

Table 16 shows design parameters, characteristics, and size of each switch of the filter according to Example 3.

TABLE 16

| Ex. 3 (Power application terminal: input/output terminal 102) | Gate width WF (mm) | Stack no. Ns (no.) | Ron (Ω) | Allowable input current (mA) | Allowable input voltage (V) | Size (µm²) |
|---|---|---|---|---|---|---|
| Switch SWs1 | 2.10 | 16 | 3.19 | 668 | 40.0 | 33600 |
| Switch SWs1a | 2.70 | 11 | 1.71 | 858 | 27.5 | 29700 |
| Switch SWp1 | 2.65 | 21 | 3.32 | 842 | 52.5 | 55650 |
| Total | 7.45 | 48 | 8.21 | 2368 | 120.0 | 118950 |

Figure 16:
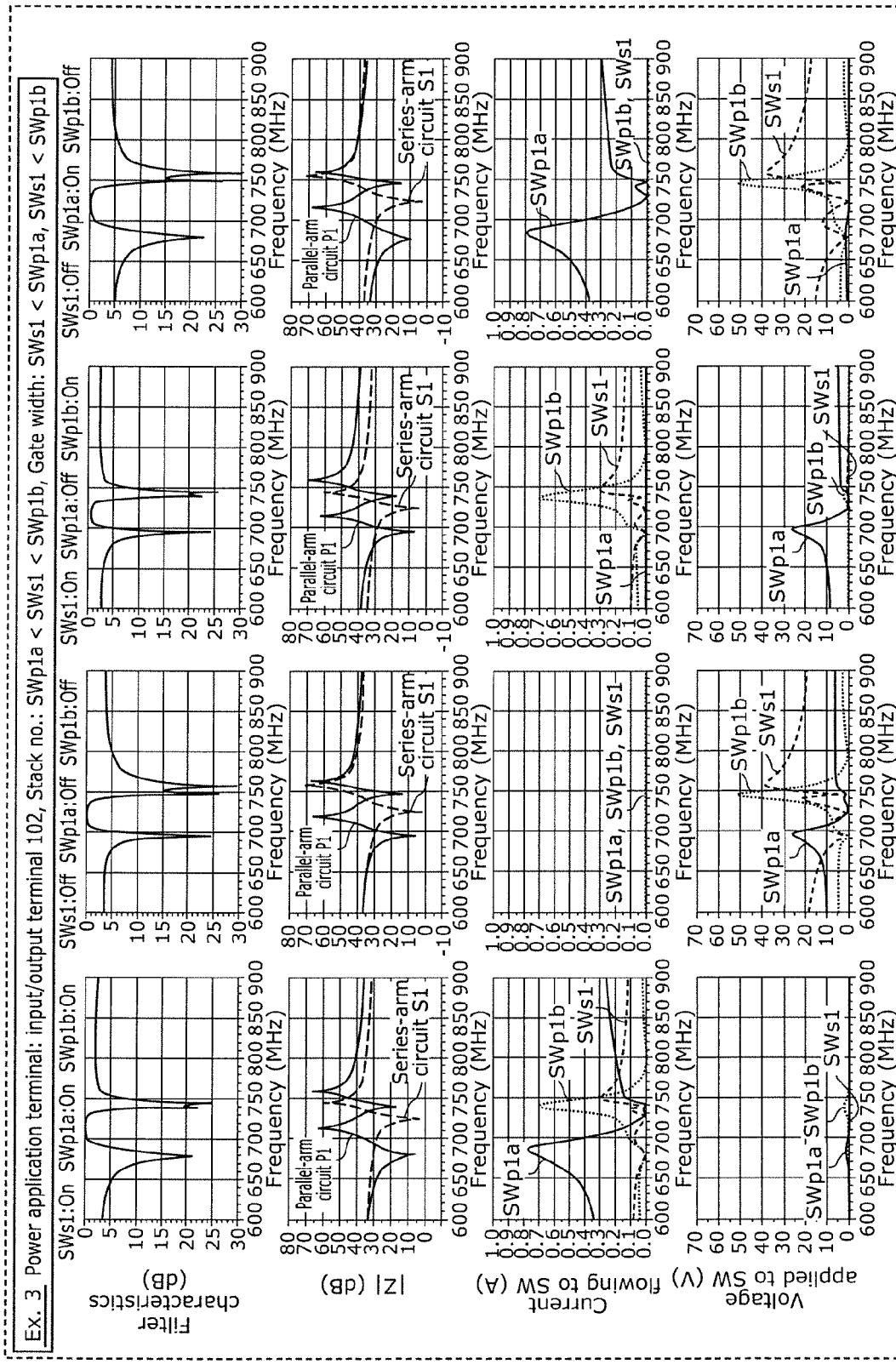
FIG. 16 is a graph showing various characteristics regarding a filter according to Example 3.

FIG. 16 is a graph showing various characteristics regarding the filter according to Example 3.

9.3) Comparison of Example 3 with Comparative Example 3

As illustrated in FIG. 15, FIG. 16, table 13, and table 15, the resonance characteristics (resonant frequencies and anti-resonant frequencies) of series-arm circuit S1 and parallel-arm circuit P1 are substantially the same in the filters according to Comparative Example 3 and Example 3.

Table 17 shows (i) insertion loss within each passband of the filters according to Comparative Example 3 and Examples 3, and (ii) the total size of the three switches.

TABLE 17

| | IL (dB) | | | | |
|---|---|---|---|---|---|
| | Case 1 (SWs1 ON) (SWp1a ON) (SWp1b ON) @705-725 MHz | Case 2 (SWs1 OFF) (SWp1a OFF) (SWp1b OFF) @710-735 MHz | Case 3 (SWs1 ON) (SWp1a OFF) (SWp1b ON) @710-725 MHz | Case 4 (SWs1 OFF) (SWp1a ON) (SWp1b OFF) @705-735 MHz | Switch Total Size (µm²) |
| Comp. Ex. 3 | 0.55 | 0.46 | 0.54 | 0.49 | 170100 |
| Ex. 3 | 0.54 | 0.46 | 0.54 | 0.46 | 118950 |

As illustrated in this table, upon comparing Comparative Example 3 and Example 3, in Example 3, it is possible to reduce the total size of the switches along with reducing loss within the passband.

In other words, in series-arm circuit S1, the impedance of switch SWs1 is exceedingly low (ideally zero) when switch SWs1 is conducting, and as illustrated in the first column of the third row and the third column of the third row of FIG. 15 and FIG. 16, the current flowing to switch SWs1 is at a maximum at the antiresonant frequency of series-arm circuit S1. However, the impedance of switch SWs1 is exceedingly high (ideally limitless) when switch SWs1 is OFF, and as illustrated in the second column of the fourth row and the fourth column of the fourth row of FIG. 15 and FIG. 16, the voltage applied to switch SWs1 is at a maximum at the antiresonant frequency of series-arm circuit S1.

In parallel-arm circuit P1, the impedance of switch SWp1a is exceedingly low (ideally zero) when switch SWp1a is ON, and as illustrated in the first column of the third row and the fourth column of the third row of FIG. 15 and FIG. 16, the current flowing to switch SWp1a is at a maximum at the resonant frequency at the low frequency side of parallel-arm circuit P1 (i.e., the resonant frequency of parallel-arm resonator p1a). However, the impedance of switch SWp1a is exceedingly high (ideally limitless) when switch SWp1a is OFF, and as illustrated in the second column of the fourth row and the third column of the fourth row of FIG. 15 and FIG. 16, the voltage applied to switch SWp1a is at a maximum at the resonant frequency at the low frequency side of parallel-arm circuit P1.

In parallel-arm circuit P1, the impedance of switch SWp1b is exceedingly low (ideally zero) when switch SWp1b is ON, and as illustrated in the first column of the third row and the third column of the third row of FIG. 15 and FIG. 16, the current flowing to switch SWp1b is at a maximum at the resonant frequency at the high frequency side of parallel-arm circuit P1 (i.e., the resonant frequency of parallel-arm resonator p1b). However, the impedance of switch SWp1b is exceedingly high (ideally limitless) when switch SWp1b is OFF, and as illustrated in the second column of the fourth row and the fourth column of the fourth row of FIG. 15 and FIG. 16, the voltage applied to switch SWp1b is at a maximum at the resonant frequency at the high frequency side of parallel-arm circuit P1.

Upon comparing the currents flowing to the switches, a maximum value of the current of switch SWs1 is lower than a maximum value of the current of switch SWp1a and a maximum value of the current of switch SWp1b. Upon comparing the voltages applied to the switches, a maximum value of the voltage of switch SWp1a is lower than a maximum value of the voltage of switch SWs1 and higher than a maximum value of the voltage of switch SWp1b.

As such, switch SWs1 makes it possible to ensure the necessary withstand current even when reducing the gate width more than the gate widths of switches SWp1a and SWp1b. Switch SWp1a makes it possible to ensure the necessary withstand voltage even when reducing the stack number more than the stack number of switch SWs1.

With Variation 3 of Embodiment 1 described with reference to Example 3, the gate width of switch SWs1 (first switch element) is smaller than the gate widths of switch SWp1a (third switch element) and switch SWp1b (second switch element). This makes it possible to ensure a withstand current realizing the power durability that filter 10C requires, while reducing the total size of switch SWs1, switch SWp1a, and switch SWp1b. It is possible to reduce the resistance when switches SWp1a and SWp1b are conducting (ON resistance), due to the gate widths of switches SWp1a and SWp1b being relatively large. As such, it is possible to reduce insertion loss within the passband of filter 10C when switches SWp1a and SWp1b are conducting. In other words, it is possible to ensure power durability while reducing insertion loss within the passband and scaling down filter 10C that is capable of changing the frequency of the attenuation pole, without needing to worsen insertion loss at an end of the passband.

In Variation 3 of Embodiment 1, the maximum voltage applied to switch SWs1 is lower than the maximum voltage applied to switch SWp1b, and the maximum voltage applied to switch SWp1a is lower than the maximum voltage applied to switch SWs1. Thus, the stack number of switch SWs1 is lower than the stack number of switch SWp1b, and the stack number of switch SWp1a is lower than the stack number of switch SWs1. This makes it possible to reduce the total size of switches SWs1 and SWp1a, while ensuring the individual withstand voltages realizing the power durability that filter 10C requires. It is possible to limit the resistance when switch SWs1 and switch SWp1a are conducting, by reducing the stack numbers of switch SWs1 and switch SWp1a. Thus, it is possible to reduce insertion loss within the passband of filter 10C when switch SWs1 and switch SWp1a are conducting. In other words, it is possible to ensure power durability while further reducing insertion loss within the passband and further scaling down filter 10C that is capable of changing the frequency of the attenuation pole, without needing to worsen insertion loss at an end of the passband.

Note that switch SWs1, switch SWp1a, and switch SWp1b may satisfy the above stack number relationships, but are not limited thereto. For example, the stack number of switch SWs1, the stack number of switch SWp1a, and the stack number of switch SWp1b may be equal. Even in such a configuration do switch SWs1, switch SWp1a, and switch SWp1b produce the following advantageous effect, by satisfying the above gate width relationships. Namely, it is possible to reduce the total size of switch SWs1, switch SWp1a, and switch SWp1b, while ensuring individual withstand voltages realizing the power durability that filter 10C requires. As a result, it is possible to ensure power durability in filter 10C, while reducing insertion loss within the passband and scaling down filter 10C.

10) Variation 4 of Embodiment 1

The configurations of the series-arm circuits and the parallel-arm circuits described up to this point may also be applied to a filter including more series-arm circuits and parallel-arm circuits. Accordingly, in the present variation, a filter will be described including five series-arm circuits and four parallel-arm circuits to which the above configuration is applied. Note that a number of the series-arm circuits and a number of the parallel-arm circuits are not limited thereto.

10.1) Circuit Configuration

Figure 17:
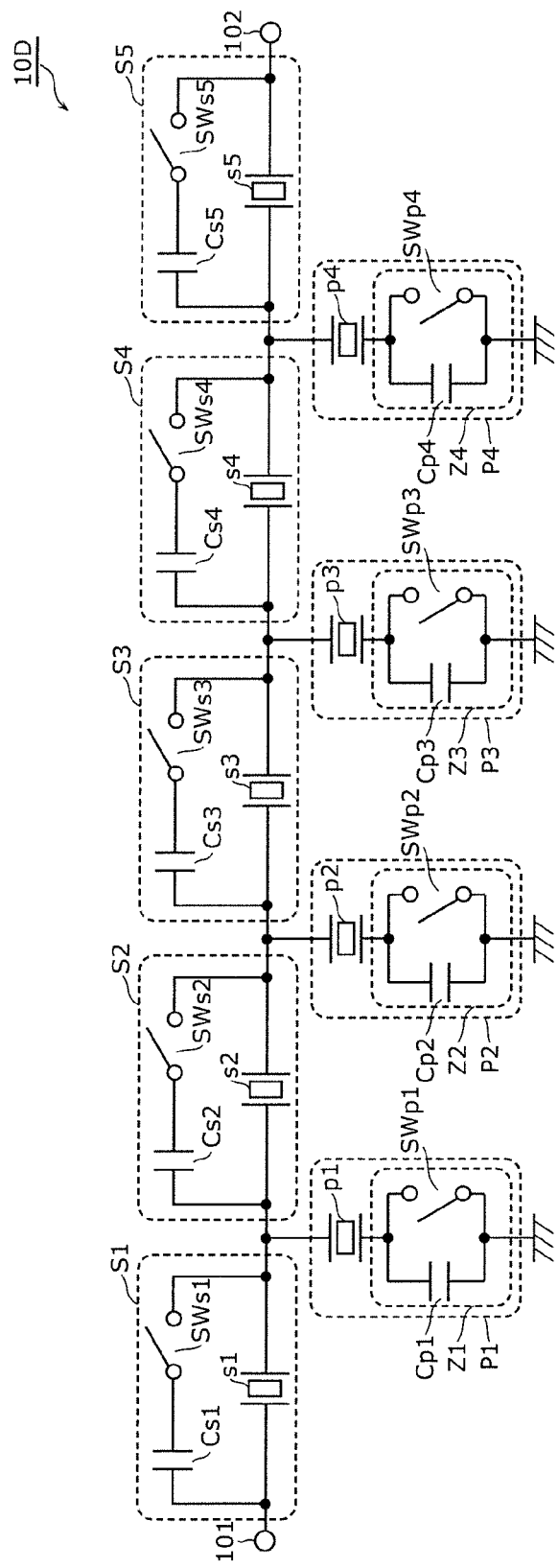
FIG. 17 is a circuit configuration diagram of a filter according to Variation 4 of Embodiment 1.

FIG. 17 is a circuit configuration diagram of filter 10D according to Variation 4 of Embodiment 1.

As illustrated in FIG. 17, filter 10D includes series-arm circuits S1, S2, S3, S4 and S5; parallel-arm circuits P1, P2, P3, and P4; and input/output terminals 101 and 102.

Series-arm circuit S1 is disposed on a path that connects input/output terminal 101 and input/output terminal 102. Series-arm circuit S2 is disposed closer to input/output terminal 102 than the path-shaped series-arm circuit S1 is. Series-arm circuit S3 is disposed closer to input/output terminal 102 than the path-shaped series-arm circuit S2 is. Series-arm circuit S4 is disposed closer to input/output terminal 102 than the path-shaped series-arm circuit S3 is. Series-arm circuit S5 is disposed closer to input/output terminal 102 than the path-shaped series-arm circuit S4 is.

Series-arm circuit S1 includes series-arm resonator s1, capacitor Cs1, and switch SWs1. Switch SWs1 is a switch element that is (i) connected in series to capacitor Cs1 and (ii) includes one or more transistors. Series-arm resonator s1 is connected in parallel to a circuit that is constituted by capacitor Cs1 and switch SWs1 connected in series.

Series-arm circuit S2 includes series-arm resonator s2, capacitor Cs2, and switch SWs2. Switch SWs2 is a switch element that is (i) connected in series to capacitor Cs2 and (ii) includes one or more transistors. Series-arm resonator s2 is connected in parallel to a circuit that is constituted by capacitor Cs2 and switch SWs2 connected in series.

Series-arm circuit S3 includes series-arm resonator s3, capacitor Cs3, and switch SWs3. Switch SWs3 is a switch element that is (i) connected in series to capacitor Cs3 and (ii) includes one or more transistors. Series-arm resonator s3 is connected in parallel to a circuit that is constituted by capacitor Cs3 and switch SWs3 connected in series.

Series-arm circuit S4 includes series-arm resonator s4, capacitor Cs4, and switch SWs4. Switch SWs4 is a switch element that is (i) connected in series to capacitor Cs4 and (ii) includes one or more transistors. Series-arm resonator s4 is connected in parallel to a circuit that is constituted by capacitor Cs4 and switch SWs4 connected in series.

Series-arm circuit S5 includes series-arm resonator s5, capacitor Cs5, and switch SWs5. Switch SWs5 is a switch element that is (i) connected in series to capacitor Cs5 and (ii) includes one or more transistors. Series-arm resonator s5 is connected in parallel to a circuit that is constituted by capacitor Cs5 and switch SWs5 connected in series.

Parallel-arm circuit P1 is connected to the ground and a node on a path between series-arm circuits S1 and S2. Parallel-arm circuit P2 is connected to the ground and a node on a path between series-arm circuits S2 and S3. Parallel-arm circuit P3 is connected to the ground and a node on a path between series-arm circuits S3 and S4. Parallel-arm circuit P4 is connected to the ground and a node on a path between series-arm circuits S4 and S5.

Parallel arm circuit P1 includes parallel-arm resonator p1, and switch circuit Z1 connected in series to parallel-arm resonator p1. Parallel arm circuit P2 includes parallel-arm resonator p2, and switch circuit Z2 connected in series to parallel-arm resonator p2. Parallel arm circuit P3 includes parallel-arm resonator p3, and switch circuit Z3 connected in series to parallel-arm resonator p3. Parallel arm circuit P4 includes parallel-arm resonator p4, and switch circuit Z4 connected in series to parallel-arm resonator p4.

Switch circuit Z1 includes capacitor Cp1 and switch SWp1. Switch SWp1 is connected in parallel to capacitor Cp1 and includes one or more transistors. Switch circuit Z2 includes capacitor Cp2 and switch SWp2. Switch SWp2 is connected in parallel to capacitor Cp2 and includes one or more transistors. Switch circuit Z3 includes capacitor Cp3 and switch SWp3. Switch SWp3 is connected in parallel to capacitor Cp3 and includes one or more transistors. Switch circuit Z4 includes capacitor Cp4 and switch SWp4. Switch SWp4 is connected in parallel to capacitor Cp4 and includes one or more transistors.

In filter 10D configured as such, a passband is configured through the resonant frequencies of series-arm circuits S1-S5 and the antiresonant frequencies of parallel-arm circuits P1-P4. An attenuation pole at the high side of the passband is configured through the antiresonant frequencies series-arm circuits S1-S5 and an attenuation pole at the low side of the passband is configured through the resonant frequencies of parallel-arm circuits P1-P4. The antiresonant frequencies of series-arm circuits S1-S5 are changed by switching between conduction and non-conduction of switches SWs1-SWs5. The antiresonant frequencies of parallel-arm circuits P1-P4 are changed by switching between conduction and non-conduction of switches SWp1-SWp4. It is, therefore, possible to make fine adjustments to the frequency of the passband and the frequency of the attenuation band, by suitably switching between conduction and non-conduction of switches SWs1-SWs5 and SWp1-SWp4.

In filter 10D being frequency-tunable through such switches SWs1-SWs5 and SWp1-SWp4, the gate widths and stack numbers of switches SWs1-SWs5 and SWp1-SWp4 are configured individually. Switches SWs1-SWs5 and SWp1-SWp4 are each described here as including one or more transistors having the same configuration, for the sake of brevity.

To be specific, at least one gate width among the gate widths of switches SWp1-SWp4 is configured to be larger than at least one gate width among the gate widths of switches SWs1-SWs5. In other words, the gate widths of switches SWs1-SWs5 and SWp1-SWp4 are configured individually to ensure the necessary withstand current. At least one stack number among the stack numbers of switches SWp1-SWp4 is configured to be different from at least one stack number among the stack numbers of switches SWs1-SWs5.

The present variation makes it possible to ensure power durability while reducing insertion loss within the passband and scaling down filter 10D that is capable of making fine adjustments to the frequency of the passband and the frequency of the attenuation pole.

Note that the stack numbers of switches SWs1-SWs5 and SWp1-SWp4 may be equal.

10.2) Structure Example

Figure 18:
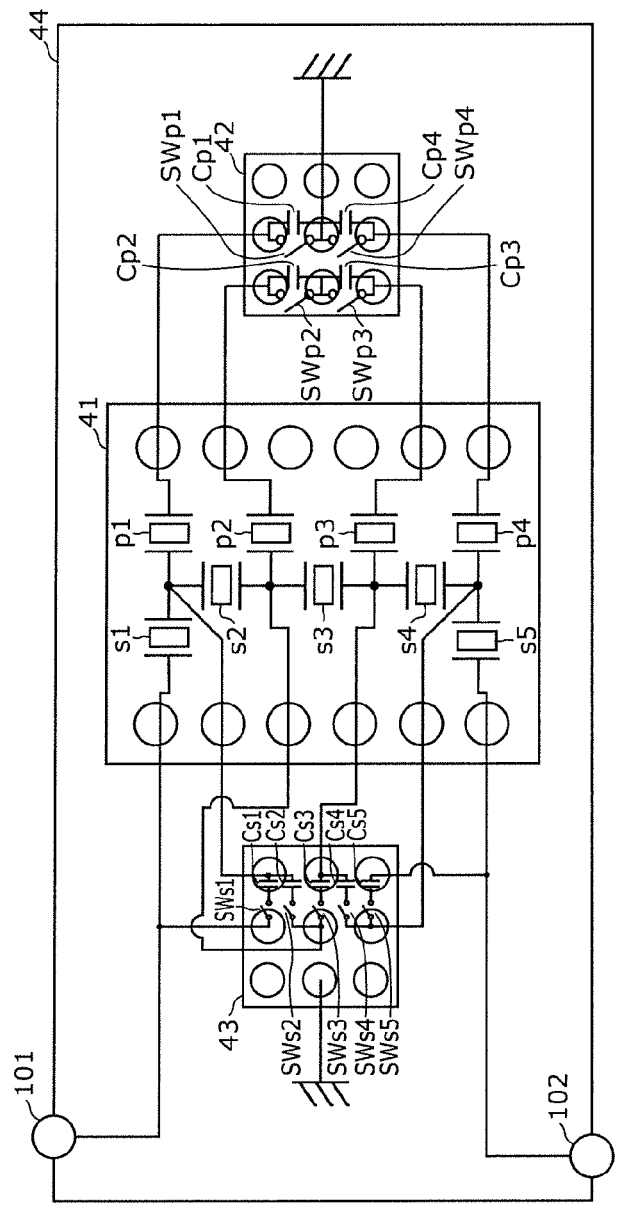
FIG. 18 is a plan view for describing a structure of the filter according to Variation 4 of Embodiment 1.

FIG. 18 is a plan view for describing a structure of filter 10D shown in FIG. 17. Series-arm resonators s1-s5 and parallel-arm resonators p1-p4 are each a surface acoustic wave resonator including an interdigital transducer (IDT) electrode disposed on a piezoelectric substrate 41 or a bulk acoustic wave resonator disposed on substrate 41, and are included in one package. Switches SWs1-SWs5 and capacitors Cs1-Cs5 are included in package 43 different from the package in which series-arm resonators s1-s5 and parallel-arm resonators p1-p4 are included. Switches SWp1-SWp4 and capacitors Cp1-Cp4 are included in package 42 different from the package in which series-arm resonators s1-s5 and parallel-arm resonators p1-p4 are included. These three packages are mounted on wiring substrate 44 and are connected by wiring disposed on wiring substrate 44.

In the present configuration, capacitors Cs1-Cs5 and capacitors Cp1-Cp4 are disposed in the package in which the switches are disposed, but may also be disposed on substrate 41 including each resonator when capacitors Cs1-Cs5 and capacitors Cp1-Cp4 are formed using comb capacitor electrodes or metal-insulator-metal (MIM) capacitor electrodes. However, with the objective of scaling down the filter, each capacitor may be disposed in the package in which the switches are disposed. The reason being that when each capacitor is disposed in the package including each resonator, it is necessary to increase the number of terminals of the package, causing an increase in size.

In the present configuration example, a switch circuit including a capacitor and a switch is disposed closer to the ground than a node on a path that connects input/output terminals 101 and 102. In contrast, when the switch circuit is disposed closer to the above node, it is necessary to increase the number of terminals in the package including the resonators and the package including the switches, causing an increase in size. From this standpoint, it is possible to scale down filter 10D, by disposing the switch circuit closer to the ground than to the node with respect to the parallel-arm resonators.

Embodiment 2

The filters described in Embodiment 1 and the examples thereof can also be applied to a multiplexer and a radio-frequency front-end circuit compatible with systems using a higher number of bands. Accordingly, in Embodiment 2, such a multiplexer, radio-frequency front-end circuit, and communication device will be described.

Figure 19:
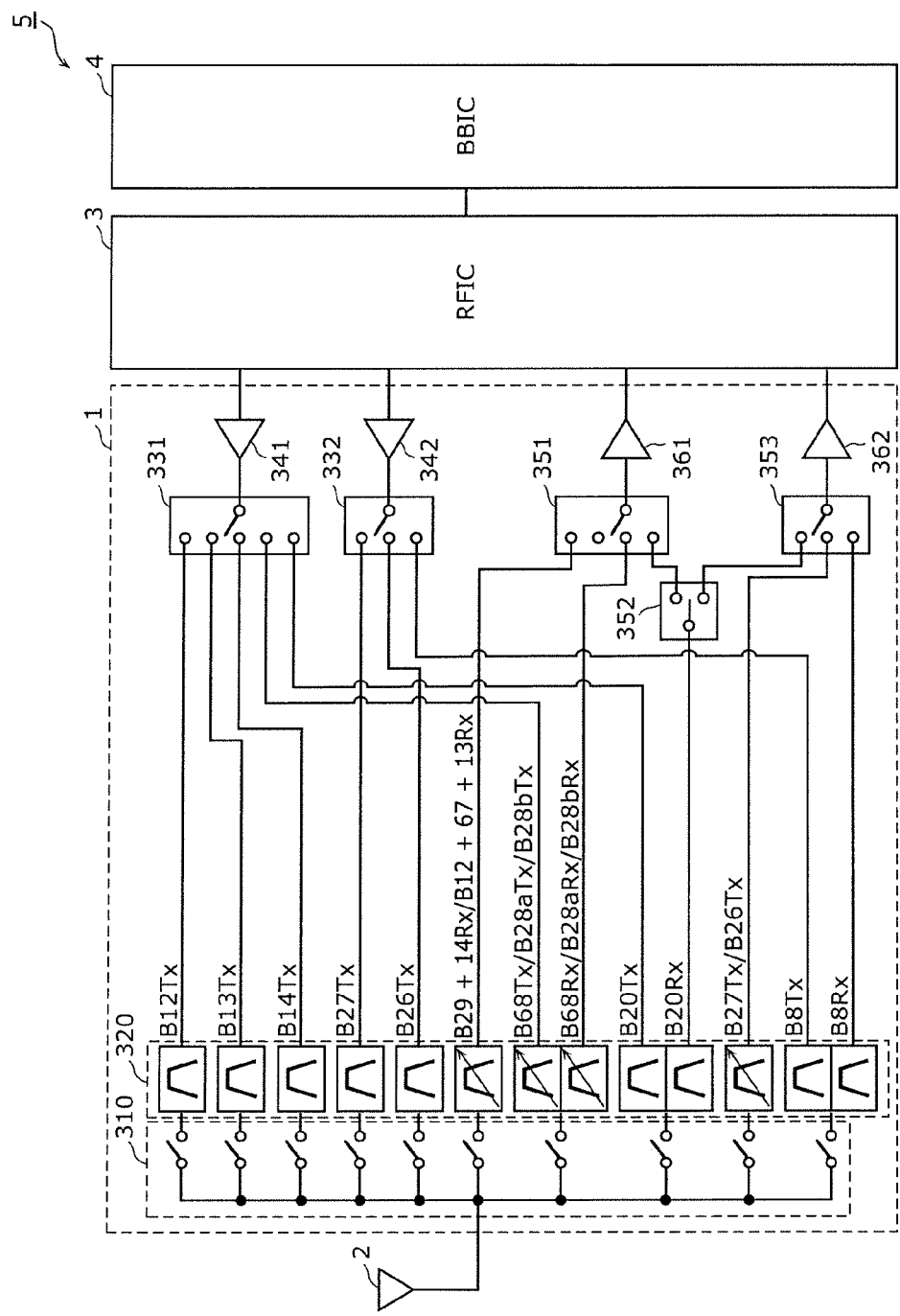
FIG. 19 is a configuration diagram of a communication device according to Embodiment 2.

FIG. 19 is a configuration diagram of communication device 5 according to Embodiment 2.

As illustrated in the drawing, communication device 5 includes switch group 310 including multiple switches; filter group 320 including multiple switches; transmission-end switches 331 and 332; reception-end switches 351, 352, and 353; transmission amplifier circuits 341 and 342; reception amplifier circuits 361 and 362; RF signal processing circuit (RFIC) 3; baseband signal processing circuit (BBIC) 4; and antenna element 2.

Switch group 310 connects antenna element 2 to a signal path compatible with a predetermined band in accordance with the control signal from the controller (not illustrated), and includes, for example, multiple SPST switches. Note that the signal path connected to antenna element 2 is not limited to be one signal path and may also be multiple signal paths. In other words, communication device 5 may be compatible with career aggregation.

Filter group 320 includes, for example, multiple filters (including a duplexer) having the following bands as their passband. To be specific, the bands are (i) a Band 12 transmission band, (ii) a Band 13 transmission band, (iii) a Band 14 transmission band, (iv) a Band 27 transmission band, (v) a Band 26 transmission band, (vi) a Band 29 and Band 14 reception band or Band 12, Band 67, and Band 13 reception band, (vii-Tx) a Band 68, Band 28a, or a Band 28b transmission band, (vii-Rx) a Band 68, Band 28a, or Band 28b reception band, (viii-Tx) a Band 20 transmission band, (viii-Rx) a Band 20 reception band, (ix-Tx) a Band 27 or Band 26 transmission band, (x-Tx) a Band 8 transmission band, and (x-Rx) a Band 8 reception band.

Transmission-end switch 331 is a switch circuit including multiple selection terminals connected to multiple low-band transmission-end signal paths whose center frequency among the bands in filter group 320 is low, and a common terminal connected to transmission amplifier circuit 341. Transmission-end switch 332 is a switch circuit including multiple selection terminals connected to multiple high-band transmission-end signal paths whose center frequency among the bands in filter group 320 is high, and a common terminal connected to transmission amplifier circuit 342. These transmission-end switches 331 and 332 are switch circuits that are disposed in a front part of filter group 320 (here, front part at the transmission-end signal paths) and change a connection state in accordance with the control signal from the controller (not illustrated). With this, the high-frequency signal amplified by transmission amplifier circuits 341 and 342 (here, the high-frequency transmission signal) are outputted to antenna element 2 via a predetermined filter of filter group 320.

Reception-end switch 351 is a switch circuit including multiple selection terminals connected to multiple low-band reception-end signal paths whose center frequency among the bands in filter group 320 is low, and a common terminal connected to reception amplifier circuit 361. Reception-end switch 352 is a switch circuit including a common terminal connected to a reception-end signal path of a predetermined band (here, Band 20), and two selection terminals connected to the common terminal of reception-end switch 351 and the common terminal of reception-end switch 352. Reception-end switch 353 is a switch circuit including multiple selection terminals connected to multiple high-band reception-end signal paths whose center frequency among the bands in filter group 320 is high, and a common terminal connected to reception amplifier circuit 362. These reception-end switches 351-353 are switch circuits that are disposed in a rear part of filter group 320 (here, rear part at the reception-end signal paths) and change a connection state in accordance with the control signal from the controller (not illustrated). With this, the high-frequency signal inputted to antenna element 2 (here, the high-frequency reception signal) is amplified by reception amplifier circuits 361 and 362 and outputted to the RF signal processing circuit (RFIC), via the predetermined filter of filter group 320. Note that an RF signal processing circuit (RFIC) compatible with the low band and an RF signal processing circuit (RFIC) compatible with the high band may be disposed separately.

Transmission amplifier circuit 341 is a power amplifier that power amplifies the low-band high-frequency transmission signal, and transmission amplifier circuit 342 is a power amplifier that power amplifies the high-band high-frequency transmission signal.

Reception amplifier circuit 361 is a low-noise amplifier that power amplifies the low-band high-frequency reception signal, and reception amplifier circuit 362 is a low-noise amplifier that power amplifies the high-band high-frequency reception signal.

RF signal processing circuit (RFIC) 3 processes a high-frequency signal to be transmitted by antenna element 2 and a high-frequency signal to be received by antenna element 2. To be specific, RF signal processing circuit (RFIC) 3 signal-processes, through downscaling and the like, the high-frequency signal (here, the high-frequency reception signal) inputted from antenna element via the reception-end signal paths, and outputs the signal-processed and generated reception signal to baseband signal processing circuit (BBIC) 4. RF signal processing circuit (RFIC) 3 signal-processes, through upscaling and the like, the transmission signal inputted from baseband signal processing circuit (BBIC) 4, and outputs the signal-processed and generated high-frequency signal (here, the high-frequency transmission signal) to the transmission-end signal paths.

Communication device 5 configured as such includes the filters according to any of Embodiment 1 and the examples thereof as at least one of: a filter having (vi) a Band 29 and Band 14 reception band or a Band 12, Band 67, and Band 13 reception band as its passband; a filter having (vii-Tx) a Band 68, Band 28a, or Band 28b transmission band as its passband; a filter having (vii-Rx) a Band 68, Band 28a, or Band 28b reception band as its passband; and a filter having (ix-Tx) a Band 27 or Band 26 transmission band as its passband. In other words, the filter changes the frequency of the passband and the frequency of the attenuation band in accordance with the control signal.

Note that among communication device 5, switch group 310; filter group 320; transmission-end switches 331 and 332; reception-end switches 351, 352, and 353; transmission amplifier circuits 341 and 342; reception amplifier circuits 361 and 362; and the above controller constitute radio-frequency front-end circuit 1. Switch group 310 and filter group 320 constitute the multiplexer. Note that in the multiplexer according to the present disclosure, filter group 320 may be connected to the common terminal via switch group 310 as in Embodiment 2, but the multiplexer may also have a configuration in which multiple filters according to according to Embodiment 1 are directly connected to the common terminal.

The above controller is not illustrated in FIG. 19, but may be included in the RF signal processing circuit (RFIC), and the controller may also be included in a switch integrated circuit (IC) along with each switch controller by the controller.

Radio-frequency front-end circuit 1 and communication device 5 configured as such make it possible to implement a high-performance radio-frequency front-end circuit 1 and communication device 5 capable of scaling down the filter and reducing insertion loss within the passband when each switch is conducting, along with ensuring the required power durability, by including the filters according to the above Embodiment 1 and the examples thereof. In other words, radio-frequency front-end circuit 1 makes it possible to ensure power durability, while improving a gain loss within the passband and scaling down radio-frequency front-end circuit 1. Communication device 5 makes it possible to ensure power durability, while improving communication quality and scaling down communication device 5.

It is possible to scale down the filter since it is possible to reduce the number of filters more than when a filter is disposed per band.

Radio-frequency front-end circuit 1 according to Embodiment 2 includes transmission-end switches 331 and 332 and reception-end switches 351-353 (switch circuits) disposed in the front part or the rear part of filter group 320 (multiple radio-frequency filters). This makes it possible to share a portion of the signal paths through which the high-frequency signal is transmitted. As such, it is possible, for example, to share transmission amplifier circuit 341 and 242 or reception amplifier circuit 361 and 362 (amplifier circuits) corresponding to the multiple filters. It is, therefore, possible to scale down and reduce cost of the radio-frequency front-end circuit.

Note that at least one of transmission-end switches 331 and 332 and reception-end switches 351-353 may be disposed. A number of transmission-end switches 331 and 332 and a number of reception-end switches 351-353 is not limited to the above description, and, for example, one transmission-end switch and one-reception end switch may also be disposed. A number of selection terminals and the like of the transmission-end switches and the reception-end switches are also not limited to Embodiment 2, and two of each may also be disposed.

Other Embodiments

The radio-frequency filter, the multiplexer, the radio-frequency front-end circuit, and the communication device according to the present disclosure have been described above with Embodiments 1 and 2 as examples, but the present disclosure is not limited to the above embodiments. Other embodiments that can be realized by combining optional structural elements in the above embodiments, variations obtainable through various modifications to the above embodiments that can be conceived by a person of ordinary skill in the art without departing from the essence of the present disclosure, or various devices including the radio-frequency filter, the multiplexer, the radio-frequency front-end circuit, and the communication device according to the present disclosure are also included in the present disclosure.

For example, at least five series-arm circuits may be disposed as long as at least two series-arm circuits are disposed.

Each of the series-arm resonators and parallel-arm resonators described above is not limited to being one resonator, and may also include multiple split resonators in which one resonator is split.

In the above description, the gate widths of one switch element have been compared with another switch element with each switch element including multiple transistors (specifically FETs) having the same configuration for the sake of brevity. However, the configuration of each switch element is not limited to the foregoing, and the configuration of one or more transistors may differ from the configurations of the other transistors. In other words, in each switch element, the gate widths of the multiple transistors are not limited to being the same and may also differ from one another.

Even in a configuration including such switch elements, the same advantageous effect as in the above description is produced due to the above relationships of the gate widths holding true.

To be specific, a withstand current of switch elements formed due to multiple transistors being connected in series is throttled back (i.e., restricted) by the withstand current of a transistor with the smallest gate width among the multiple transistors. Accordingly, it is necessary to realize a withstand current of each of the multiple transistors in order to satisfy the withstand current that the switch element including the multiple transistors requires.

Therefore, concerning the second switch element that requires a greater withstand current than the first switch element, the gate width of each of the multiple transistors included in the second switch element is larger than at least one gate width of the multiple transistors included in the first switch element, for example. This makes it possible to ensure a withstand current realizing the power durability that the radio-frequency filter and the like require, while reducing the total size of the second switch element and the first switch element.

In switch elements formed by multiple transistors being connected in series, enlarging the gate width of a transistor other than the transistor with the smallest gate width does not contribute to improving the withstand current of all switch elements and also hinders scaling down the switch elements. Accordingly, in order to scale down the switch elements, it is necessary to not enlarge the gate widths of the other transistors too much.

Therefore, for example, concerning the first switch element that does not require as great a withstand current as the second switch element, the gate width of each of the multiple transistors included in the first switch element may be smaller than the gate width of any of the multiple transistors included in the second switch element. This makes it possible to further scale down the first switch element, while ensuring a withstand current realizing the power durability that the radio-frequency filter and the like require. In other words, it is possible to further scale down the radio-frequency filter and the like including the first switch element, while reducing insertion loss within the passband and ensuring power durability.

In the above description, an example of each switch element including multiple transistors has been described, but each switch element may also include one transistor.

For example, the controller may be disposed outside of RF signal processing circuit (RFIC) 3, but may also be disposed, for example, in radio-frequency front-end circuit 1. In other words, radio-frequency front-end circuit 1 is not limited to the above-described configuration and may also include the radio-frequency filter having a frequency-tunable circuit, and the controller that controls conduction and non-conduction of a switch element of the frequency-tunable circuit. Radio-frequency front-end circuit 1 configured as such makes it possible to change the passband in accordance with the required frequency specifications, while limiting an increase in insertion loss at an end of the passband.

For example, in radio-frequency front-end circuit 1 or communication device 5, an inductor or a capacitor may be connected between each of the structural elements. Note that the inductor may include a wiring inductor through wiring connected each of the structural elements.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure can be widely used in communication devices, such as mobile telephones, as a compact filter, multiplexer, front-end circuit, and communication device that can be adopted for use in multi-band systems.

The invention claimed is:
1. A radio-frequency filter, comprising:
a series-arm circuit disposed on a path that connects a first input/output terminal and a second input/output terminal; and
a parallel-arm circuit connected to a node on the path and a ground, wherein
the series-arm circuit includes:
a first impedance element, a first switch element connected to the first impedance element, and a series-arm resonator connected in parallel to the first impedance element and the first switch element,
the parallel-arm circuit includes:
a first parallel-arm resonator, and a first switch circuit connected in series to the first parallel-arm resonator, the first switch circuit includes a second switch element, wherein
the first switch element and the second switch element each include a plurality of transistors, and
to accommodate a maximum flow through the second switch element, which occurs at a resonant frequency at which an impedance of the parallel-arm is at minimum, and a maximum current flow through the first switch element that occurs at an antiresonant frequency at which an impedance of the series arm-circuit is minimum, and wherein gate widths of the plurality of transistors included in the second switch element are greater in width than gate widths of the plurality of transistors of the first switch element to improve power durability of the parallel-arm resonator and the radio frequency filter.
2. The radio-frequency filter according to claim 1, wherein
under a definition of a total number of transistors for a particular a switch element being a stack number for that particular switch element, a stack number of the first switch element being different than a stack number of the second switch element.

3. The radio-frequency filter according to claim 2, wherein
the stack number of the first switch element is lower than the stack number of the second switch element.

4. The radio-frequency filter according to claim 1, wherein
the first input/output terminal is a terminal to which radio-frequency electric power is applied, and
the node is located on the path between the series-arm circuit and the second input/output terminal.

5. The radio-frequency filter according to claim 1, wherein
the first switch circuit further includes a second impedance element that is one of an inductor and a capacitor, the second impedance element being connected to the second switch element.

6. The radio-frequency filter according to claim 5, wherein
the first switch circuit includes the second impedance element and the second switch element connected in parallel.

7. The radio-frequency filter according to claim 5, wherein
the first switch circuit further includes a third impedance element that is an other of the inductor and the capacitor, the third impedance element being connected in series to the second switch element, and
a circuit that that includes the third impedance element and the second switch element connected in series is connected in parallel to the second impedance element.

8. The radio-frequency filter according to claim 7, wherein
the first switch circuit includes a plurality of circuits each of which having a structure of the third impedance element and the second switch element connected in series, and
the plurality of circuits are connected in parallel to one another and are connected in parallel to the second impedance element.

9. The radio-frequency filter according to claim 5, wherein
the parallel-arm circuit further includes a second parallel-arm resonator connected in parallel to a circuit that that includes the first parallel-arm resonator and the first switch circuit connected in series, wherein
a resonant frequency of the first parallel-arm resonator is lower than a resonant frequency of the second parallel-arm resonator, and
an antiresonant frequency of the first parallel-arm resonator is lower than an antiresonant frequency of the second parallel-arm resonator.

10. The radio-frequency filter according to claim 5, wherein
the parallel-arm circuit further includes a second parallel-arm resonator connected in parallel to a circuit that includes the first parallel-arm resonator and the first switch circuit connected in series, wherein
a resonant frequency of the first parallel-arm resonator is higher than a resonant frequency of the second parallel-arm resonator, and
an anti resonant frequency of the first parallel-arm resonator is higher than an antiresonant frequency of the second parallel-arm resonator.

11. The radio-frequency filter according to claim 9, wherein
the second impedance element is the capacitor, and
an electrostatic capacitance of the first parallel-arm resonator is greater than an electrostatic capacitance of the second parallel-arm resonator.

12. The radio-frequency filter according to claim 10, wherein
the second impedance element is the capacitor, and
an electrostatic capacitance of the first parallel-arm resonator is greater than an electrostatic capacitance of the second parallel-arm resonator.

13. The radio-frequency filter according to claim 8, wherein
the parallel-arm circuit further includes a second parallel-arm resonator, and a second switch circuit connected in series to the second parallel-arm resonator,
the second switch circuit includes:
a fourth impedance element that is one of an inductor and a capacitor; and
a third switch element that is connected in parallel to the fourth impedance element, and includes one or more transistors,
a resonant frequency of the first parallel-arm resonator and a resonant frequency of the second parallel-arm resonator are different,
an antiresonant frequency of the first parallel-arm resonator and an antiresonant frequency of the second parallel-arm resonator are different, and
a circuit that is constituted by the first parallel-arm resonator and the first switch circuit connected in series and a circuit that is constituted by the second parallel-arm resonator and the second switch circuit connected in series are connected in parallel.

14. The radio-frequency filter according to claim 13, wherein
a gate width of each of the one or more transistors included in the third switch element is larger than the gate width of the plurality of transistors included in the first switch element.

15. The radio-frequency filter according to claim 14, wherein
the resonant frequency of the second parallel-arm resonator is lower than the resonant frequency of the first parallel-arm resonator,
the antiresonant frequency of the second parallel-arm resonator is lower than the antiresonant frequency of the first parallel-arm resonator, and
under a definition of a total number of transistors for a particular switch element being a stack number for that particular switch element,
a stack number of the first switch element is lower than a stack number of the second switch element, and
a stack number of the third switch element is lower than the stack number of the first switch element.

16. A multiplexer, comprising:
a plurality of filters, an input/output terminal of each of the plurality of filters is directly or indirectly connected to a common terminal, the plurality of filters includes a radio-frequency filter that includes
a series-arm circuit disposed on a path that connects a first input/output terminal and a second input/output terminal; and a parallel-arm circuit connected to a node on the path and a ground, wherein the series-arm circuit includes:
a first impedance element, a first switch element connected to the first impedance element, and a series-arm resonator connected in parallel to the first impedance element and the first switch element, the parallel-arm circuit includes:
a first parallel-arm resonator, and a first switch circuit connected in series to the first parallel-arm resonator, the first switch circuit includes a second switch element, wherein the first switch element and the second switch element each include a plurality of transistors, and to accommodate a maximum flow through the second switch element, which occurs at a resonant frequency at which an impedance of the parallel-arm is at minimum, and a maximum current flow through the first switch element that occurs at an antiresonant frequency at which an impedance of the series arm-circuit is minimum, and wherein gate widths of the plurality of transistors included in the second switch element are greater in width than gate widths of the plurality of transistors of the first switch element to improve power durability of the parallel-arm resonator and the radio frequency filter.

17. A radio-frequency front-end circuit, comprising:
a multiplexer having a plurality of filters, an input terminal or an output terminal of each of the plurality of filters being directly or indirectly connected to a common terminal, the plurality of filters includes a radio-frequency filter; and an amplifier circuit directly or indirectly connected to the radio-frequency filter, wherein the radio-frequency filter comprising a series-arm circuit disposed on a path that connects a first input/output terminal and a second input/output terminal; and a parallel-arm circuit connected to a node on the path and a ground, wherein the series-arm circuit includes:
a first impedance element, a first switch element connected to the first impedance element, and a series-arm resonator connected in parallel to the first impedance element and the first switch element, the parallel-arm circuit includes:
a first parallel-arm resonator, and a first switch circuit connected in series to the first parallel-arm resonator, the first switch circuit includes a second switch element, wherein the first switch element and the second switch element each include a plurality of transistors, and to accommodate a maximum flow through the second switch element, which occurs at a resonant frequency at which an impedance of the parallel-arm is at minimum, and a maximum current flow through the first switch element that occurs at an antiresonant frequency at which an impedance of the series arm-circuit is minimum, and wherein gate widths of the plurality of transistors included in the second switch element are greater in width than gate widths of the plurality of transistors of the first switch element to improve power durability of the parallel-arm resonator and the radio frequency filter.

18. The radio-frequency front-end circuit according to claim 17, wherein
the amplifier circuit is a power amplifier that amplifies a radio-frequency transmission signal, and
the radio-frequency transmission signal amplified by the power amplifier is inputted to the first input/output terminal or the second input/output terminal of the radio-frequency filter.

19. The radio-frequency front-end circuit according to claim 17, wherein
the amplifier circuit is a low-noise amplifier that amplifies a high-frequency, reception signal, and
the radio-frequency reception signal amplified by the low-noise amplifier is outputted from the first input/output terminal or the second input/output terminal of the radio-frequency filter.

20. A communication device, comprising:
a radio frequency (RF) signal processing circuit that processes a radio-frequency signal to be transmitted by an antenna element and a radio-frequency signal received by the antenna element; and
the radio-frequency front-end circuit according to claim 17 that conveys the radio-frequency signals between the antenna element and the RF signal processing circuit.

* * * * *